(12) United States Patent
Yoshida

(10) Patent No.: US 12,410,904 B2
(45) Date of Patent: Sep. 9, 2025

(54) LIGHT EMITTING MODULE

(71) Applicant: NICHIA CORPORATION, Anan (JP)

(72) Inventor: Norimasa Yoshida, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/851,776

(22) PCT Filed: Mar. 24, 2023

(86) PCT No.: PCT/JP2023/011949
§ 371 (c)(1),
(2) Date: Sep. 27, 2024

(87) PCT Pub. No.: WO2023/190217
PCT Pub. Date: Oct. 5, 2023

(65) Prior Publication Data
US 2025/0216057 A1    Jul. 3, 2025

(30) Foreign Application Priority Data

Mar. 29, 2022 (JP) ................................. 2022-054467

(51) Int. Cl.
*F21V 14/08* (2006.01)
*F21V 9/30* (2018.01)
*F21Y 105/10* (2016.01)

(52) U.S. Cl.
CPC ............... *F21V 14/08* (2013.01); *F21V 9/30* (2018.02); *F21Y 2105/10* (2016.08)

(58) Field of Classification Search
CPC ............ F21V 14/08; F21V 9/30; F21V 14/06; F21V 14/00; F21V 9/32; F21V 9/38; F21Y 2105/10
See application file for complete search history.

(56) References Cited

U.S. PATENT DOCUMENTS

| | | |
|---|---|---|
| 4,444,478 A | 4/1984 | Keith et al. |
| 2010/0254115 A1 | 10/2010 | Wegh et al. |

(Continued)

FOREIGN PATENT DOCUMENTS

| | | |
|---|---|---|
| JP | S59-102218 A | 6/1984 |
| JP | H01-010796 A | 1/1989 |

(Continued)

OTHER PUBLICATIONS

International Search Report and Written Opinion of the International Searching Authority issued in the corresponding International Patent Application No. PCT/JP2023/011949, dated May 16, 2023 with English language translations.

*Primary Examiner* — Bao Q Truong
(74) *Attorney, Agent, or Firm* — Foley & Lardner LLP

(57) ABSTRACT

A light emitting module includes a plurality of light emitting parts; an optical member including at least one first region where light having a first chromaticity is extracted and at least one second region where light having a second chromaticity different from the first chromaticity is extracted, and configured to transmit or pass light emitted from the plurality of light emitting parts; a change mechanism configured to change a distance between the optical member and the plurality of light emitting parts in a direction along a center axis of the first lens; and a first lens on which light transmitted or passing through the optical member is incident. The first region or the second region is provided so as to correspond to one of the plurality of light emitting parts.

13 Claims, 19 Drawing Sheets

(56) References Cited

U.S. PATENT DOCUMENTS

| | | |
|---|---|---|
| 2014/0055661 A1 | 2/2014 | Imamura et al. |
| 2017/0196060 A1 | 7/2017 | Watanabe et al. |
| 2018/0066809 A1 | 3/2018 | Vdovin et al. |
| 2019/0024854 A1 | 1/2019 | Annen et al. |
| 2022/0328739 A1* | 10/2022 | Yoshida ................. F21S 41/19 |

FOREIGN PATENT DOCUMENTS

| | | |
|---|---|---|
| JP | 2003-098426 A | 4/2003 |
| JP | 2004-349647 A | 12/2004 |
| JP | 2008-227042 A | 9/2008 |
| JP | 2009-048920 A | 3/2009 |
| JP | 2010-529610 A | 8/2010 |
| JP | 2012-022308 A | 2/2012 |
| JP | 2012-221634 A | 11/2012 |
| JP | 2016-028370 A | 2/2016 |
| JP | 2017-120897 A | 7/2017 |
| JP | 2018-004752 A | 1/2018 |
| JP | 2018-511910 A | 4/2018 |
| WO | WO-2013/114891 A1 | 8/2013 |
| WO | WO-2016/021675 A1 | 2/2016 |
| WO | WO-2017/038176 A1 | 3/2017 |

\* cited by examiner

FIG.14
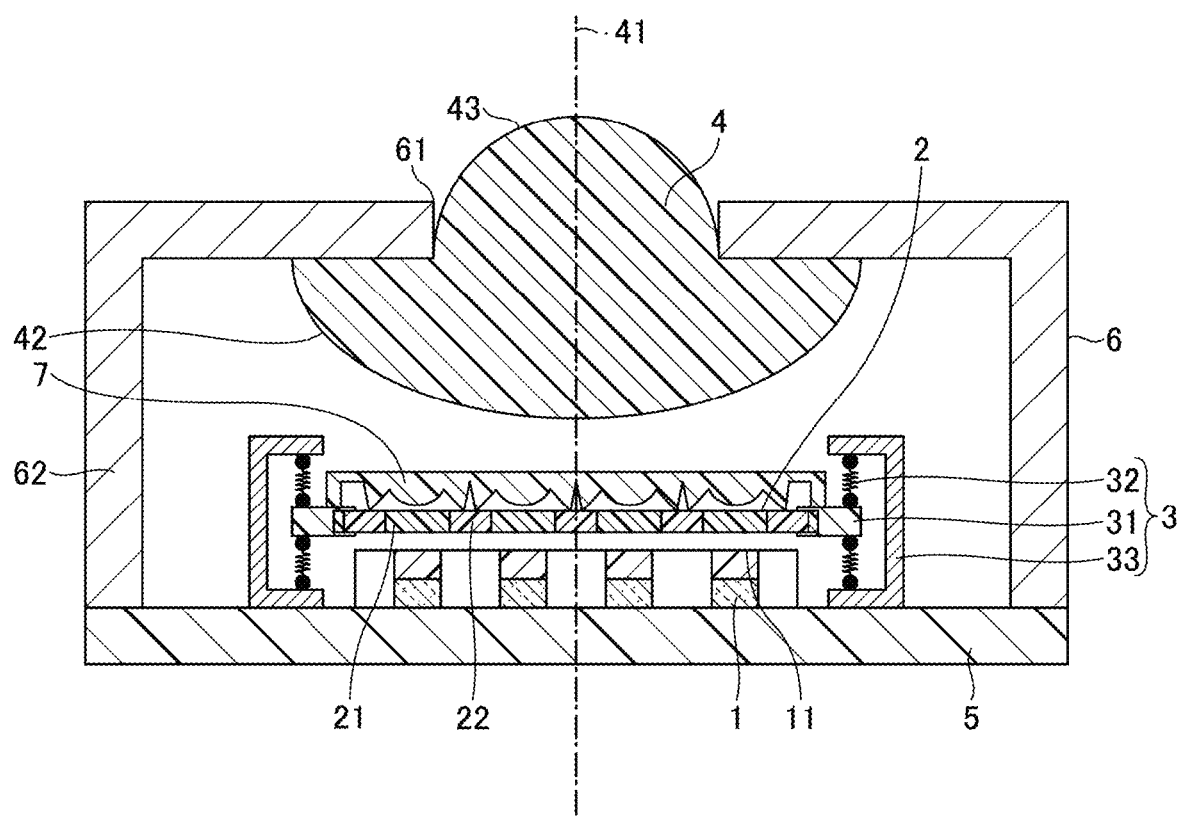
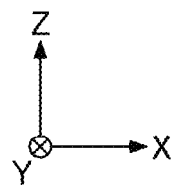

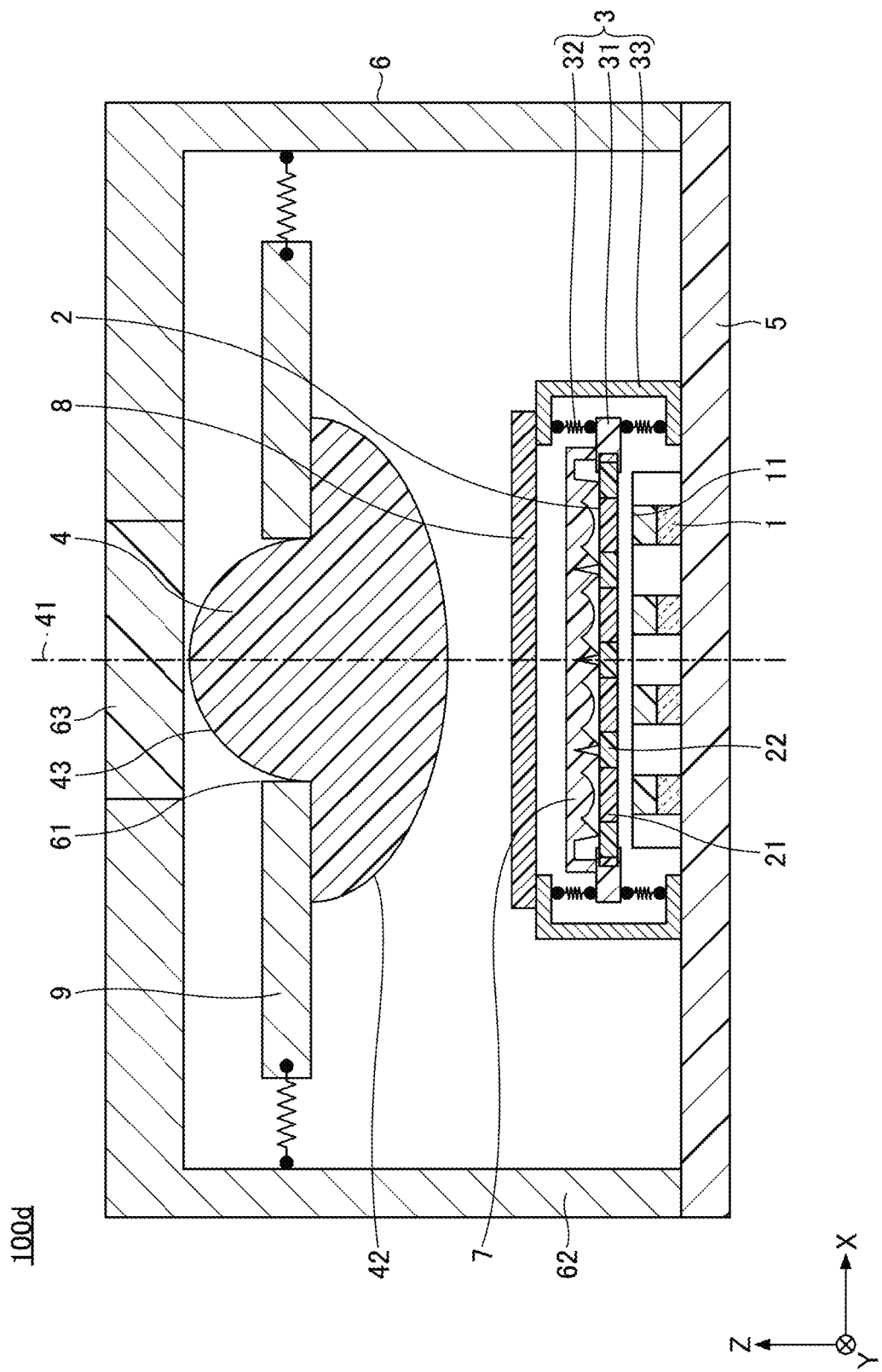

LIGHT EMITTING MODULE

TECHNICAL FIELD

The present disclosure relates to a light emitting module.

BACKGROUND ART

Light emitting modules that perform color adjustment by using an optical member that converts a wavelength of light from a light emitting part are known.

Further, a configuration in which the thickness of a sealing resin immediately above a plurality of sets of light emitting parts differs for each of the sets, and thus the chromaticity of light emitted from the sealing resin differs when each of the plurality of sets of light emitting parts emits the light on a per-set basis is disclosed (see Patent Document 1, for example).

RELATED-ART DOCUMENTS

Patent Documents

Patent Document 1: Japanese Patent Publication No. 2017-120897

SUMMARY OF THE INVENTION

Problem to be Solved by the Invention

However, with the configuration in Patent Document 1, because each of the plurality of sets of light emitting parts emits light on a per-set basis, the degree of freedom in color adjustment of a light emitting module is low.

An object of the present disclosure is to provide a light emitting module having a high degree of freedom in color adjustment of light.

Means to Solve the Problem

A light emitting module according to one embodiment of the present disclosure includes a plurality of light emitting parts; an optical member including at least one first region where light having a first chromaticity is extracted and at least one second region where light having a second chromaticity different from the first chromaticity is extracted, and configured to transmit or pass light emitted from the plurality of light emitting parts; a change mechanism configured to change a distance between the optical member and the plurality of light emitting parts; and a first lens on which light transmitted or passing through the optical member is incident. At least one of the first region or the second region is provided in one-to-one correspondence with each of the plurality of light emitting parts. The change mechanism changes the distance between the optical member and the plurality of light emitting parts in a direction along a center axis of the first lens.

Effects of the Invention

According to one embodiment of the present disclosure, a light emitting module having a high degree of freedom in color adjustment of light can be provided.

BRIEF DESCRIPTION OF THE DRAWINGS

FIG. 14 is a cross-sectional view illustrating the configuration of a light emitting module according to a third embodiment;

FIG. 17 is a cross-sectional view illustrating the configuration of a light emitting module according to a fourth embodiment;

MODE FOR CARRYING OUT THE INVENTION

Figure 1:
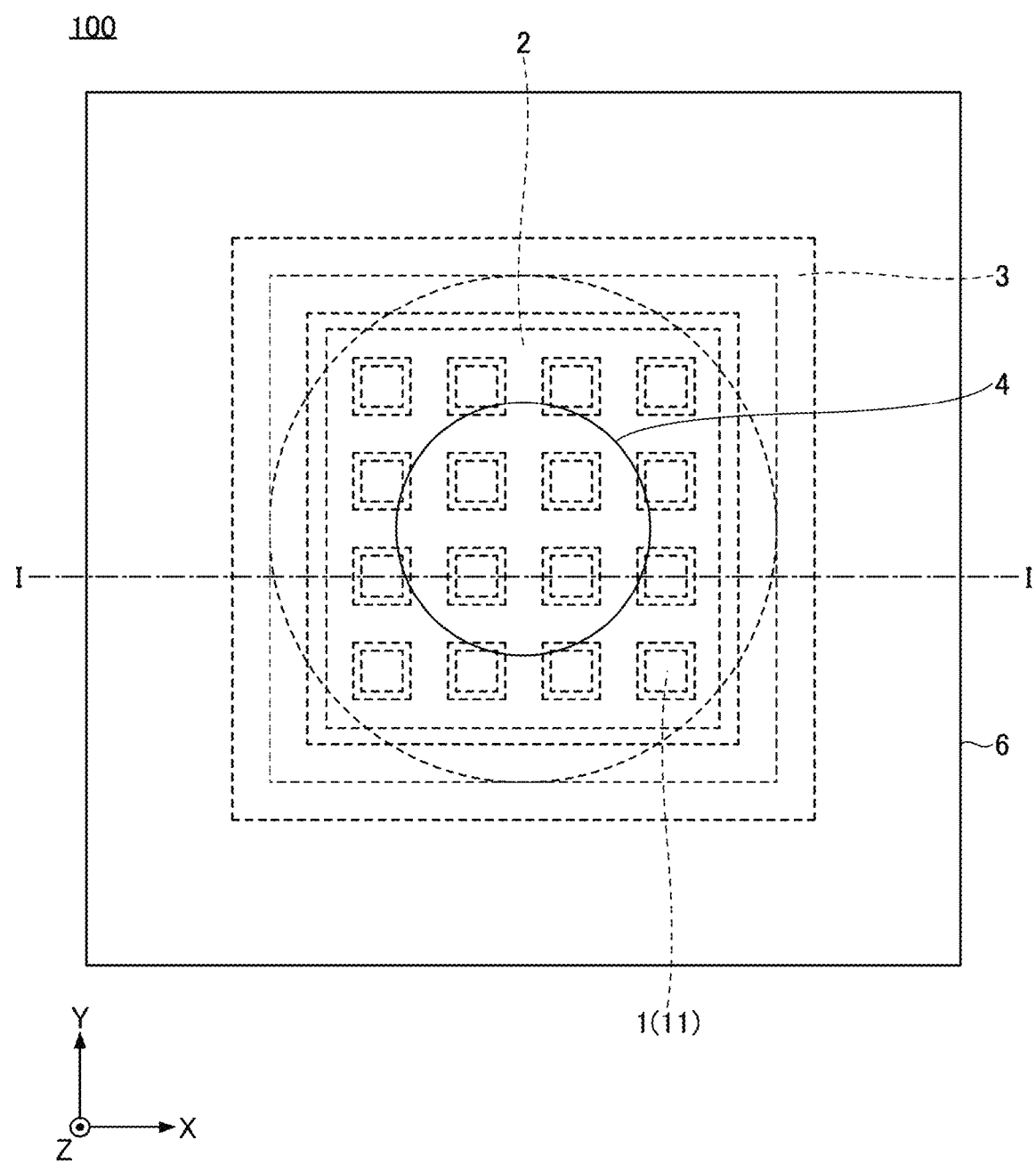
FIG. 1 is a top view illustrating the configuration of a light emitting module according to a first embodiment.

In the following, embodiments of the present disclosure will be described with reference to the drawings. In the following description, the same reference numerals appearing in a plurality of drawings refer to the same or similar portions or members. A duplicate description of the same or similar portions or members will be omitted as appropriate. An end view illustrating only a cut surface may be used as a cross-sectional view.

The following embodiments exemplify a light emitting module to embody the technical idea of the present invention, and the present invention is not limited to the following description. Unless otherwise specified, the dimensions, materials, shapes, relative arrangements, and the like of components described below are not intended to limit the scope of the present invention thereto, but are described as examples. Further, the sizes, positional relationships, and the like of members illustrated in the drawings may be exaggerated for clearer illustration.

In the drawings, directions may be indicated by an X-axis, a Y-axis, and a Z-axis. An X direction along the X-axis indicates any one direction. A Y direction along the Y-axis indicates a direction substantially orthogonal to the X direction, and a Z direction along the Z-axis indicates a direction substantially orthogonal to both the X direction and the Y direction.

Further, a direction indicated by an arrow in the X direction is referred to as a +X direction, and a direction opposite to the +X direction is referred to as a −X direction. A direction indicated by an arrow in the Y direction is referred to as a +Y direction, and a direction opposite to the +Y direction is referred to as a −Y direction. A direction indicated by an arrow in the Z direction is referred to as a +Z direction, and a direction opposite to the +Z direction is referred to as a −Z direction. In the embodiments, a plurality of light emitting parts included in a light emitting module are configured to emit light to the +Z side as an example. In the drawings, the light emitted from the light emitting parts may be indicated by solid arrows, dashed arrows, or the like. Further, the term "top view" as used in the embodiments refers to viewing the light emitting module from the +Z side. However, these directions do not limit the orientation of the light emitting module during use, and the orientation of the light emitting module is arbitrary. In addition, in the embodiments, a surface of an object when viewed from the +Z side is referred to as an "upper surface", and a surface of the object when viewed from the −Z side is referred to as a "lower surface".

Further, the optical axes of the plurality of light emitting parts and the center axis of a first lens are along the Z-axis. In the embodiments described below, each of the phrases "along the X-axis", "along the Y-axis", and "along the Z-axis" includes a case where the object is at an inclination within a range of ±10° with respect to the corresponding one of the axes.

A light emitting module according to an embodiment is used in applications such as various lightings or light irradiation. The light emitting module includes a plurality of light emitting parts, and an optical member. The optical member includes at least one first region where light having a first chromaticity is extractable and at least one second region where light having a second chromaticity different from the first chromaticity is extractable, and is configured to transmit or pass light emitted from the plurality of light emitting parts. Further, the light emitting module includes a change mechanism configured to change a distance between the optical member and the plurality of light emitting parts, and a first lens on which light transmitted or passing through the optical member is incident. The change mechanism is configured to change the distance between the optical member and the plurality of light emitting parts in a direction along a center axis of the first lens.

The optical member adjusts, of the light emitted from each of the plurality of light emitting parts, the ratio of the amounts of light of different colors that is the light transmitted through or passing through the first region or the second region. In the present specification, adjusting the ratio of the amounts of light of different colors encompasses mixing light of different colors. In the embodiment, the light emitting module having a high degree of freedom in color adjustment of light can be provided by allowing the change mechanism to change the distance between the optical member and the plurality of light emitting parts to appropriately change the chromaticity of light mixed by the optical member. As used herein, the term "color adjustment" refers to adjustment of the color of light.

In the present specification, "light transmitting through the optical member (for example, the first region or the second region)" means that light emitted from each of the light emitting parts enters the inside of the optical member and exits the optical member after a wavelength is converted or without wavelength conversion. In the optical member through which light is transmitted, a region of the optical member where light emitted from each of the light emitting parts is allowed to intentionally enter or exit may be referred to as a transmitting portion. Further, "light passing through the optical member (for example, the first region or the second region)" means that light emitted from each of the light emitting parts passes through a through-hole provided in the optical member. In the optical member through which light passes, a region where light emitted from each of the light emitting parts is allowed not to intentionally enter into the optical member and allowed to pass through a through-hole may be referred to as a pass-through portion.

First Embodiment (Example of Overall Configuration of Light Emitting Module 100)

Figure 2:
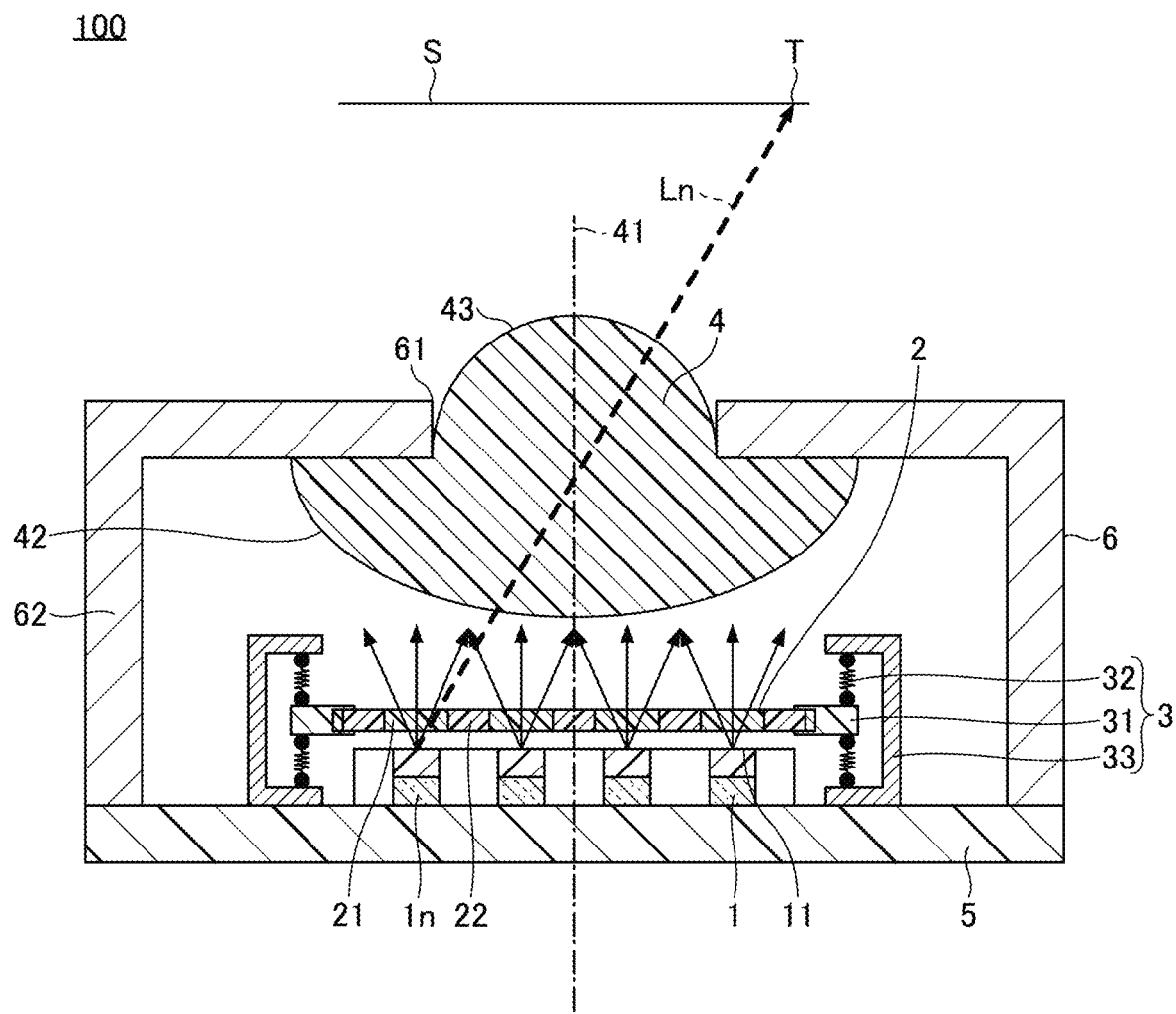
FIG. 2 is a cross-sectional view taken through section line I-I of FIG. 1.

The configuration of a light emitting module 100 according to a first embodiment will be described with reference to FIG. 1 and FIG. 2. FIG. 1 and FIG. 2 are diagrams illustrating an example of the configuration of the light emitting module 100. FIG. 1 is a top view of the light emitting module, and FIG. 2 is a cross-sectional view taken through section line I-I of FIG. 1.

As illustrated in FIG. 1 and FIG. 2, the light emitting module 100 includes a plurality of light emitting parts 1, an optical member 2, a change mechanism 3, and a first lens 4.

The plurality of light emitting parts 1 are arranged in a grid pattern along the X direction and the Y direction, and are mounted on the surface on the +Z side (in other words, the upper surface) of a light-emitting-part mounting substrate 5. The light-emitting-part mounting substrate 5 is a plate-shaped member having a substantially rectangular shape in a top view, and is a substrate including wiring on which light emitting elements and various electrical elements can be mounted.

A housing 6 is provided on the surface on the +Z side of the light-emitting-part mounting substrate 5. The plurality of light emitting parts 1, a filter 2 that is the optical member, the change mechanism 3, and the first lens 4 are housed in the housing 6. The first lens 4 is disposed such that a convex portion of the first lens 4 is exposed to the +Z side through an opening 61 of the housing 6.

Each of the plurality of light emitting parts 1 has a substantially rectangular shape in a top view. Each of the plurality of light emitting parts 1 has a light emitting surface 11 and emits light toward the filter 2 provided on the +Z side with respect to the plurality of light emitting parts 1.

The light emitting surfaces 11 refer to main light extraction surfaces of the light emitting parts 1. Light emitting diodes (LEDs) or the like can be used as the light emitting parts 1. Light emitted from the light emitting parts 1 may be white light as will be described later, and may be monochromatic light. By selecting the light emitting parts 1 according to the use of the light emitting module 100, the wavelength and the chromaticity of light emitted from the light emitting parts 1 can be appropriately selected.

The filter 2 includes a first region 21 where light having a first chromaticity can be extracted, and a second region 22 where light having a second chromaticity different from the first chromaticity can be extracted (see FIG. 2). The filter 2 is an example of the optical member that transmits light emitted from the plurality of light emitting parts 1. The filter 2 is provided between the plurality of light emitting parts 1 and the first lens 4.

In the present embodiment, a plurality of first regions 21 are provided in one-to-one correspondence with the plurality of light emitting parts 1. However, the configuration is not limited thereto, and at least one of a first region 21 or a second region 22 may be provided in one-to-one correspondence with each of the plurality of light emitting parts 1.

In the state illustrated in FIG. 2, after light emitted from each of the plurality of light emitting parts 1 is transmitted through a corresponding one of the first regions 21, the light is incident on the first lens 4 provided on the +Z side of the filter 2. Most of the light emitted from each of the plurality of light emitting parts 1 is not incident on the second region 22 of the filter 2 and thus is substantially not transmitted through the second region 22.

The change mechanism 3 is a mechanism that changes the distance between the filter 2 and the plurality of light emitting parts 1. In the present embodiment, the change mechanism 3 changes the distance between the filter 2 and the light emitting parts 1 in the Z direction along a center axis 41 of the first lens 4, thereby changing the chromaticity of light mixed by the filter 2. In the first lens 4 illustrated in FIG. 2, the center axis 41 of the first lens 4 substantially coincides with the optical axis of the first lens 4.

The change mechanism 3 includes a mover 31, a spring 32, and a support 33. The mover 31 is movable along the Z direction and is connected to the support 33 via the spring 32. The spring 32 has elasticity and can return the mover 31 to an initial position in the Z direction.

The change mechanism 3 includes a drive unit such as a voice coil motor in which the mover 31 including a coil moves in translation in a magnetic field created by magnets, an ultrasonic motor that converts natural vibration generated by a metal elastic body into translational movement of the mover 31 by frictional force, or the like. The change mechanism 3 moves the mover 31 in the Z direction by the drive force of the drive unit. However, the change mechanism 3 does not necessarily include the drive unit, and may have any configuration as long as the change mechanism 3 can change the distance between the filter 2 and the plurality of light emitting parts 1 in the direction along the center axis 41 of the first lens 4. For example, the change mechanism 3 may have a configuration in which the drive unit is not included, and a person manually changes the distance between the filter 2 and the plurality of light emitting parts 1 and then fixes the filter 2.

The mover 31 is a frame-shaped member having a substantially rectangular shape in a top view. The filter 2 is fixed to the inner side of the mover 31. The change mechanism 3 can move the filter 2 along the Z direction by moving the mover 31 along the Z-axis, and thus the distance between the filter 2 and each of the plurality of light emitting parts 1 can be changed along the Z direction.

The support 33 illustrated in FIG. 1 and FIG. 2 is a frame-shaped member having a substantially rectangular shape in a top view, however, the shape of the support 33 is not limited thereto. The support 33 may have a substantially circular shape, a substantially polygonal shape, or the like in a top view according to the shape of the filter 2 in a top view.

The first lens 4 is a lens on which light has been emitted from each of the plurality of light emitting parts 1 and transmitted through the filter 2 is incident. In the present embodiment, the light transmitted through the filter 2 exits from the light emission surface of the first lens 4 to the +Z side.

In the present embodiment, the first lens 4 is a biconvex single lens having a first convex surface 42 protruding toward the plurality of light emitting parts 1 and a second convex surface 43 protruding toward the side opposite to the plurality of light emitting parts 1. The radius of curvature of the first convex surface 42 is larger than the radius of curvature of the second convex surface 43. Further, the first lens 4 is formed in a substantially circular shape in a top view. However, the first lens 4 is not limited the biconvex single lens, and may be a concave lens or a meniscus lens, or may be a combined lens including a plurality of lenses. The radius of curvature, the thickness of the lens, and the like can be appropriately changed. Further, the shape of the first lens 4 in a top view is not limited to the substantially circular shape, and may be a substantially elliptical shape or a substantially polygonal shape such as a substantially triangular shape or a substantially rectangular shape.

The first lens 4 is optically transmissive to light emitted from the light emitting parts 1 and includes at least one of a resin material, such as a polycarbonate resin, an acrylic resin, a silicone resin, or an epoxy resin, or a glass material. As used herein, "optically transmissive" refers to a property that allows 60% or more of the light from the light emitting parts 1 to be transmitted.

In the present embodiment, in a top view, a position at which a light emitting part 1 of the plurality of light emitting parts 1 is disposed and an irradiation position irradiated with light emitted from this light emitting part 1 through the first lens 4 are point-symmetric with respect to the center axis 41 of the first lens 4.

For example, as illustrated in FIG. 2, light Ln emitted from a light emitting part 1n disposed on the −X side relative to the center axis 41 among the plurality of light emitting parts 1 exits the first lens 4 to an irradiation position T located on the +X side relative to the center axis 41 in an irradiation region S. The light emitting part 1n and the irradiation position T are point-symmetric. In FIG. 2, the distance from the light emitting part 1n to the center axis 41 in the X direction is substantially equal to the distance from the irradiation position T to the center axis 41 in the X direction. The irradiation region S may be a surface such as a screen or a wall, or may be an imaginary plane in a space. The distance from the light emitting part 1n to the center axis 41 in the X direction is not necessarily equal to the distance from the irradiation position T to the center axis 41 in the X direction.

The housing 6 has the opening 61 and includes a holding portion 62. The opening 61 is formed in a substantially circular shape in a top view. The opening 61 is larger than the outer edge of the second convex surface 43 of the first lens 4 in a top view such that the second convex surface 43 is exposed from the opening 61. The surface on the −Z side of the holding portion 62 is fixed to the surface on the +Z side of the light-emitting-part mounting substrate 5 by an adhesive member or the like.

The housing 6 preferably has a light shielding property. For example, the housing 6 preferably includes a resin material containing a filler such as a light reflecting member or a light absorbing member, or the like. Accordingly, the amount of stray light can be reduced, and thus the contrast of irradiation light of the light emitting module 100 can be improved.

The shape of the housing 6 is not limited to the above-described shape, and the housing 6 having a substantially circular shape, a substantially elliptical shape, a substantially polygonal shape, or the like in a top view may be used.

(Example Configuration of Light Emitting Parts 1)

Figure 3:
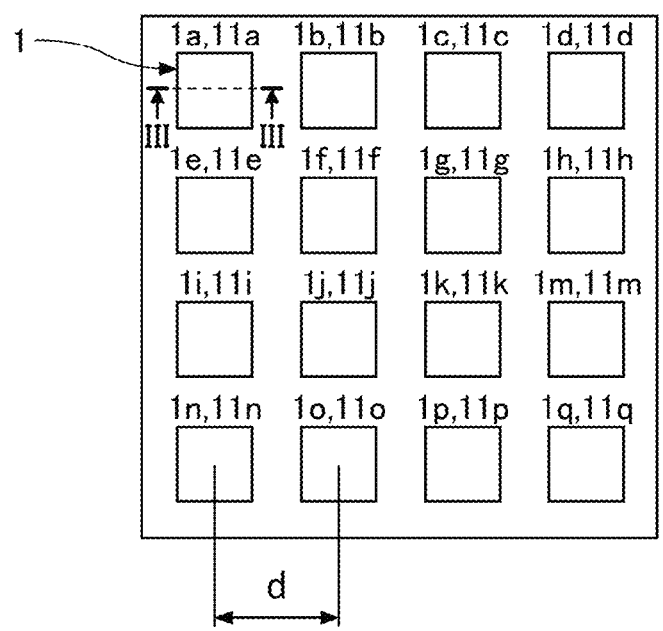
FIG. 3 is a top view of a plurality of light emitting parts as viewed from the first lens side.
Figure 4:
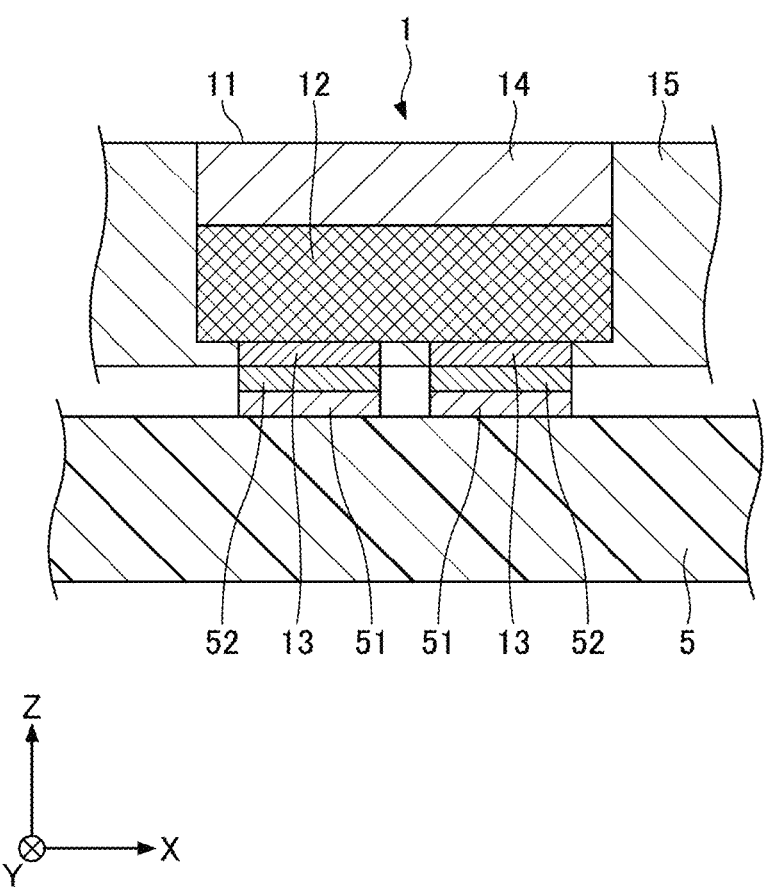
FIG. 4 is a cross-sectional view taken through section line III-III of FIG. 3.

The configuration of the plurality of light emitting parts 1 will be described with reference to FIG. 3 and FIG. 4. FIG. 3 is a top view of the plurality of light emitting parts 1. FIG. 4 is a cross-sectional view taken through section line III-III of FIG. 3.

As illustrated in FIG. 3 and FIG. 4, the plurality of light emitting parts 1 include sixteen light emitting parts 1*a*, 1*b*, 1*c*, 1*d*, 1*e*, 1*f*, 1*g*, 1*h*, 1*i*, 1*j*, 1*k*, 1*m*, 1*n*, 1*o*, 1*p*, and 1*q* arranged in the X direction and the Y direction or in a grid pattern in a top view. The X direction is an example of a lateral direction, and the Y direction is an example of a vertical direction.

The light emitting part 1*a* has a light emitting surface 11*a*, the light emitting part 1*b* has a light emitting surface 11*b*, the light emitting part 1*c* has a light emitting surface 11*c*, the light emitting part 1*d* has a light emitting surface 11*d*, the light emitting part 1*e* has a light emitting surface 11*e*, the light emitting part if has a light emitting surface 11*f*, and the light emitting part 1*g* has a light emitting surface 11*g*. The light emitting part 1*h* has a light emitting surface 11*h*, the light emitting part 1*i* has a light emitting surface 11*i*, the light emitting part 1*j* has a light emitting surface 11*j*, the light emitting part 1*k* has a light emitting surface 11*k*, the light emitting part 1*m* has a light emitting surface him, the light emitting part in has a light emitting surface 11*n*, the light emitting part 1*p* has a light emitting surface lip, and the light emitting part 1*q* has a light emitting surface 11*q*. The light emitting parts 1 overlap the respective light emitting surfaces 11 in a top view, and thus the reference numeral of each of the light emitting parts 1 is illustrated together with the reference numeral of a corresponding one of the light emitting surfaces 11 in FIG. 3.

The light emitting surface 11*a* to the light emitting surface 11*a* are preferably disposed within the first lens 4 (inward relative to the outer edge of the first lens 4) in a top view. With this configuration, light emitted from the light emitting surfaces 11 can be efficiently incident on the first lens 4, and thus the light extraction efficiency of the first lens 4 can be improved.

A distance d is the distance by which the centers of adjacent light emitting parts 1 are spaced apart from each other along the X direction in a top view. The distance d may be the distance by which the centers of adjacent light emitting parts 1 are spaced apart from each other along the Y direction in a top view.

The sixteen light emitting parts 1 arranged in the vertical direction and the lateral direction or in a grid pattern are depicted in FIG. 3, however, the number and the arrangement of the light emitting parts 1 are not limited thereto. The number of the light emitting parts 1 may be at least two, and the number and the arrangement of the light emitting parts 1 can be appropriately changed according to the use or the like of the light emitting module 100.

As illustrated in FIG. 4, the surface on the +Z side of a light emitting part 1 serves as a light emitting surface 11, and the surface opposite the light emitting surface 11 serves as a mounting surface. The light emitting part 1 is disposed such that the mounting surface faces the surface on the +Z side of the light-emitting-part mounting substrate 5.

The light emitting part 1 according to the present embodiment includes a light emitting element 12, a light transmissive member 14 provided on the surface on the +Z side of the light emitting element 12, and a covering member 15 covering the lateral surfaces of the light emitting element 12 and the lateral surfaces of the light transmissive member 14 except for the surface on the +Z side of the light transmissive member 14.

The light emitting surface 11 according to the present embodiment has a quadrangular shape with one side being 100 μm or more and 1,000 μm or less. In the present embodiment, the shape of the light emitting surface 11 in a top view is a substantially rectangular shape, but may be a substantially circular shape, a substantially elliptical shape, a polygonal shape such as a substantially triangular shape or a substantially hexagonal shape, or the like.

The light emitting element 12 is a semiconductor element that itself emits light when voltage is applied. The light emitting element 12 includes at least a semiconductor layered body, and preferably includes at least a pair of electrodes 13 having different polarities, for example, a p-side electrode and an n-side electrode on the surface opposite to the upper surface of the light emitting element 12. The shape of the light emitting element 12 in a top view is, for example, a quadrangular shape with one side being 50 μm or more and 1,000 μm or less. The area or the length of one side of the light emitting element 12 in a top view may be different from the area or the length of one side of the light emitting surface 11 in a top view.

The semiconductor layered body is preferably formed of various semiconductors such as group III-V compound semiconductors and group II-VI compound semiconductors. As the material of a semiconductor, a nitride semiconductor is preferably used. The nitride semiconductor is mainly represented by the general formula $In_xAl_yGa_{1-x-y}N$ ($0 \leq x$, $0 \leq y$, $x+y \leq 1$), and can emit short wavelength light that can efficiently excite a wavelength conversion substance that can be included in the light transmissive member 14 described later. The peak emission wavelength of the light emitting element 12 is preferably 400 nm or more and 530 nm or less, more preferably 420 nm or more and 490 nm or less, and even more preferably 450 nm or more and 475 nm or less from the viewpoints of light emission efficiency, excitation of the wavelength conversion substance, a color mixing relationship with the light emitted from the wavelength conversion substance, and the like. Further, as the material of the semiconductor, an InAlGaAs semiconductor, an InAlGaP semiconductor, or the like can be used. In the present embodiment, the light emitting module 100 in which a light emitting element emitting blue light is used as the light emitting element 12 will be described as an example.

The light transmissive member 14 is a plate-shaped member having a substantially rectangular shape in a plan view and covers the upper surface of the light emitting element 12. The light transmissive member 14 can be formed by using a light-transmissive resin material or an inorganic material such as a ceramic or glass. As the resin material, a thermosetting resin such as a silicone resin, a modified silicone resin, an epoxy resin, a modified epoxy resin, a phenol resin, or the like can be used. Particularly, a silicone resin or a modified resin thereof with good light resistance and heat resistance is suitably used. As used herein, the term "light-transmissive" means that 60% or more of the light from the light emitting element 12 is preferably transmitted.

Further, the light transmissive member 14 may include the resin described above and a light diffusion member or a wavelength conversion substance. The wavelength conversion substance absorbs at least a portion of primary light emitted from the light emitting element 12, and emits secondary light of a wavelength different from that of the primary light. Examples of the light transmissive member 14 including the resin and the wavelength conversion substance include a member containing the wavelength conversion substance in a resin material, a ceramic, glass, or the like, and a sintered body of the wavelength conversion substance. Further, the light transmissive member 14 may include a resin layer containing the wavelength conversion substance or the light diffusion material in the surface on the −Z side of a sintered body of a resin, a ceramic, glass, or the like. Further, a light diffusion layer including a resin, a ceramic, glass, or the like may be provided on light transmissive members 14 so as to be continuous between adjacent light emitting parts 1.

Examples of the wavelength conversion substance include a yttrium aluminum garnet based phosphor (for example, $Y_3(Al, Ga)_5O_{12}:Ce$), a lutetium aluminum garnet based phosphor (for example, $Lu_3(Al, Ga)_5O_{12}:Ce$), a terbium aluminum garnet based phosphor (for example, $Tb_3(Al, Ga)_5O_{12}:Ce$), a CCA based phosphor (for example, $Ca_{10}(PO_4)_6C_{12}:Eu$), an SAE based phosphor (for example, $Sr_4Al_{14}O_{25}:Eu$), a chlorosilicate based phosphor (for example, $Ca_8MgSi_4O_{16}C_{12}:Eu$), a nitride based phosphor, a fluoride based phosphor, a phosphor having a perovskite structure (for example, $CsPb(F, Cl, Br, I)_3$), a quantum dot phosphor (for example, CdSe, InP, $AgInS_2$, $AgInSe_2$, $AgInGaS_2$, or $CuAgInS_2$), and the like. Examples of the nitride based phosphor include a β-sialon based phosphor (for example, $(Si, Al)_3(O, N)_4:Eu$), an α-sialon based phosphor (for example, $Ca (Si, Al)_{12}(O, N)_{16}:Eu$), an SLA based phosphor (for example, $SrLiAl_3N_4:Eu$), a CASN based phosphor (for example, $CaAlSiN_3:Eu$), a SCASN based phosphor (for example, $(Sr, Ca)AlSiN_3:Eu$), and the like. Examples of the fluoride based phosphor include a KSF based phosphor (for example, $K_2SiF_6:Mn$), a KSAF based phosphor (for example, $K_2(Si, Al) F_6:Mn$), an MGF based phosphor (for example, $3.5MgO·0.5MgF_2·GeO_2:Mn$), and the like. The phosphors described above are particles. Further, one of these wavelength conversion substances can be used alone, or two or more of these wavelength conversion substances can be used in combination.

The KSAF based phosphor may have a composition represented by Formula (I) below.

$$M_2[Si_pAl_qMn_rF_s] \quad (I)$$

In Formula (I), M represents an alkali metal and may include at least K. Mn may be a tetravalent Mn ion. p, q, r, and s may satisfy $0.9 \leq p+q+r \leq 1.1$, $0 < q \leq 0.1$, $0 < r \leq 0.2$, $5.9 \leq s \leq 6.1$. Preferably, p, q, r, and s may satisfy $0.95 \leq p+q+r \leq 1.05$ or $0.97 \leq p+q+r \leq 1.03$, $0 < q \leq 0.03$, $0.002 \leq q \leq 0.02$, or $0.003 \leq q \leq 0.015$, $0.005 \leq r \leq 0.15$, $0.01 \leq r \leq 0.12$, or $0.015 \leq r \leq 0.1$, and $5.92 \leq s \leq 6.05$ or $5.95 \leq s \leq 6.025$. Examples of the composition represented by Formula (I) include compositions represented by $K_2[Si_{0.946}Al_{0.005}Mn_{0.049}F_{5.985}]$  $K_2[Si_{0.942}Al_{0.008}Mn_{0.050}F_{5.992}]$, $K_2[Si_{0.939}Al_{0.014}Mn_{0.047}F_{5.986}]$. Such a KSAF based phosphor enables red light emission having a high luminance and a peak emission wavelength with a narrow full width at half maximum.

In the present embodiment, the light emitting part 1 uses a blue light emitting element as the light emitting element 12. The light transmissive member 14 includes a wavelength conversion substance that converts a wavelength of light emitted from the light emitting element 12 into a wavelength of yellow light, so that the light emitting part 1 emits white light.

Examples of the light diffusion member included in the light transmissive member 14 include titanium oxide, barium titanate, aluminum oxide, silicon oxide, and the like.

The covering member 15 is a member that covers the lateral surfaces of the light emitting element 12 and the lateral surfaces of the light transmissive member 14. The covering member 15 directly or indirectly covers the lateral surfaces of the light emitting element 12 and the lateral surfaces of the light transmissive member 14. The upper surface of the light transmissive member 14 is exposed from the covering member 15, and constitutes the light emitting surface 11 of the light emitting part 1. The covering member 15 may be separated between adjacent light emitting parts 1.

In order to improve the light extraction efficiency, the covering member 15 is preferably composed of a member having a high light reflectance. For example, a resin material containing a light reflective substance such as a white pigment can be used for the covering member 15.

Examples of the light reflective substance include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, silicon oxide, and the like. It is preferable to use one of the above substances alone or a combination of two or more of the above substances.

Further, as the resin material, it is preferable to use, as a base material, a resin material whose main component is a thermosetting resin such as an epoxy resin, a modified epoxy resin, a silicone resin, a modified silicone resin, or a phenol resin. The covering member 15 may be configured with a light transmissive member that transmits visible light as necessary.

The light-emitting-part mounting substrate 5 preferably includes wiring 51 disposed on at least one of the surface or the inside of the light-emitting-part mounting substrate 5. The light-emitting-part mounting substrate 5 and the light emitting part 1 are electrically connected to each other by connecting the wiring 51 of the light-emitting-part mounting substrate 5 to at least the pair of positive and negative electrodes 13 via electrically-conductive adhesive members 52. The configuration, the size, and the like of the wiring 51 of the light-emitting-part mounting substrate 5 are set according to the configuration, the size, and the like of the electrodes 13 of the light emitting part 1.

As a base material, the light-emitting-part mounting substrate 5 preferably uses an insulating material, preferably uses a material through which light emitted from the light emitting part 1, external light, or the like is not easily transmitted, and preferably uses a material having a certain strength. Specifically, the light-emitting-part mounting substrate 5 can include, as a base material, a ceramic such as alumina, aluminum nitride, mullite, or silicon nitride, or a resin such as a phenol resin, an epoxy resin, a polyimide resin, a bismaleimide triazine resin (BT resin), or polyphthalamide.

The wiring 51 can be composed of at least one selected from the group consisting of copper, iron, nickel, tungsten, chromium, aluminum, silver, gold, titanium, palladium, rhodium, alloys thereof, and the like. In addition, a layer of silver, platinum, aluminum, rhodium, gold, an alloy thereof, or the like may be provided on the surface layer of the wiring 51 from the viewpoint of wettability and/or light reflectivity of the electrically-conductive adhesive members 52.

(Filter 2)

Figure 5:
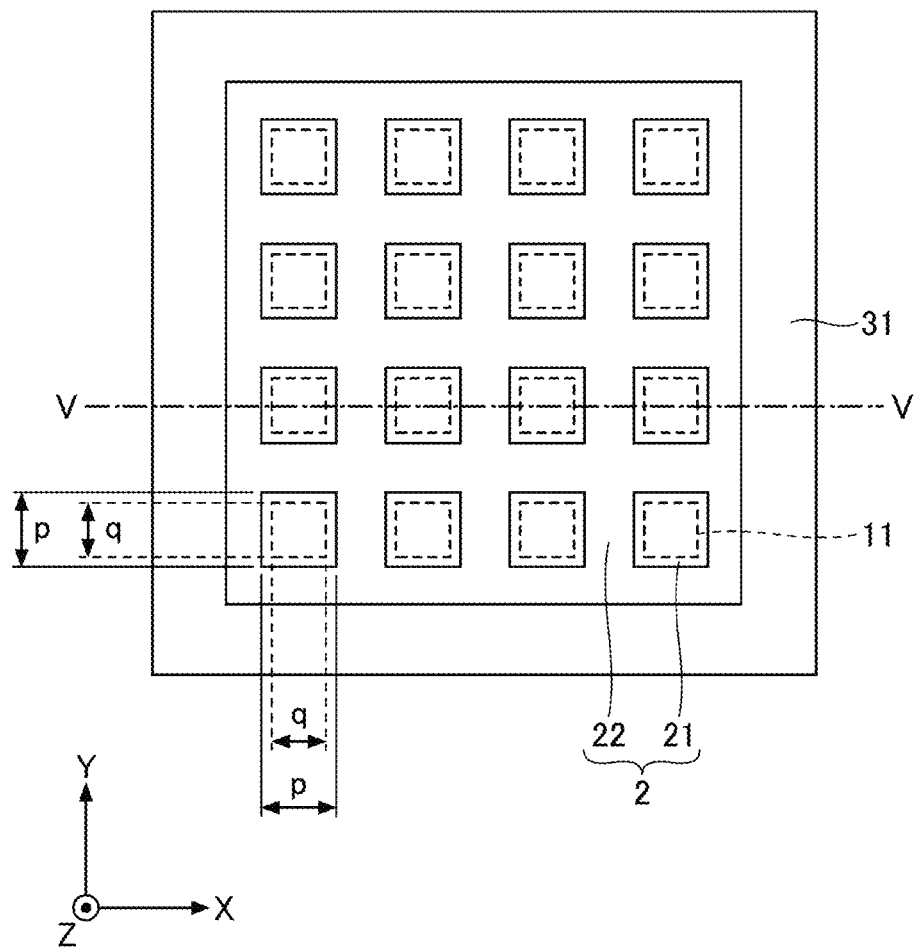
FIG. 5 is a top view of a filter according to the first embodiment.
Figure 6:
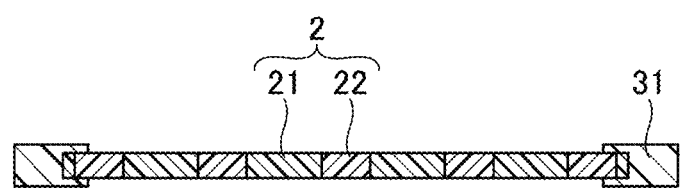
FIG. 6 is a cross-sectional view taken through section line V-V of FIG. 5.

The configuration of the filter 2 will be described with reference to FIG. 5 and FIG. 6. FIG. 5 is a top view of the filter 2. FIG. 6 is a cross-sectional view taken through section line V-V of FIG. 5.

As illustrated in FIG. 5 and FIG. 6, the filter 2 includes a plurality of first regions 21 provided in one-to-one correspondence with light emitting surfaces 11, and a second region 22 provided around each of the first regions 21.

The plurality of first regions 21 illustrated in FIG. 2 are arranged in a grid pattern along the X direction and the Y direction. The filter 2 is fixed to the inner side of the mover 31.

The filter 2 is a plate-shaped member including a resin material such as silicone, or a glass material. The first regions 21 include transmitting portions through which light emitted from light emitting parts 1 is transmitted. Each of the transmitting portions according to the present embodiment does not include a wavelength conversion substance, a color filter, and the like that convert a wavelength of the light emitted from the light emitting parts 1. The second region 22 includes a color filter that transmits light having a given wavelength of the light emitted from the light emitting parts 1.

The first regions 21 are optically transmissive to the light emitted from the light emitting parts 1, and transmit the light emitted from the light emitting parts 1 while not substantially absorbing or not substantially reflecting the light. As used herein, "optically transmissive" refers to a property that allows 60% or more of the light from the light emitting parts 1 to be transmitted. In the present embodiment, the light emitting parts 1 emit white light, and thus the first regions 21 can extract white light. White is an example of the first chromaticity.

The light emitting surfaces 11 are located inward of the respective first regions 21 in a top view. A region width p of the first region 21 in the X direction is greater than a light emitting surface width q of the light emitting surface 11 in the X direction. Further, a region width p of the first region in the Y direction is greater than a light emitting surface width q of the light emitting surface 11 in the Y direction. In FIG. 5, the region widths p of the first region 21 in the X direction and the Y direction are substantially equal to each other, and the light emitting surface widths q of the light emitting surface 11 in the X direction and the Y direction are substantially equal to each other. The expression "located inward of a first region 21" includes "located on the boundary between the first region 21 and the second region 22". That is, the outer edge of the light emitting surface 11 may substantially completely overlap the outer edge of the corresponding one of the first regions 21 in a top view. The region width p and the light emitting surface width q may be widths along the Y direction. Further, in FIG. 5, in order to illustrate the positional relationship between the light emitting surfaces 11 and the first regions 21, the light emitting surfaces 11 are illustrated in a top view of the filter 2, however, the light emitting surfaces 11 are not components of the filter 2.

The second region 22 transmits a portion of the light emitted from the light emitting parts 1 by reflecting the portion of the light emitted from the light emitting parts 1 or absorbing a portion of the light emitted from the light emitting parts 1. The color filter included in the second region 22 is a member in which the above described wavelength conversion substance(s) or a dye substance(s) composed of an inorganic compound or an organic compound including a metal oxide is contained in a base material such as a resin, for example, silicone, or glass. The dye substance is a member that absorbs at least a portion of primary light emitted from the light emitting parts 1 and transmits secondary light of a given wavelength among the wavelengths included in the primary light.

In the present embodiment, the second region 22 extracts light having a chromaticity corresponding to amber as a portion of light. Amber is an orange-based color, and is what is known as warm white. Amber is an example of the second chromaticity.

In the present embodiment, the filter 2 having a substantially rectangular shape in a top view is exemplified, however, the shape of the filter 2 is not limited thereto. The shape of the filter 2 in a top view may be, for example, a substantially circular shape, a substantially polygonal shape, or the like. Further, the filter 2 may be, for example, a sheet-shaped member instead of a plate-shaped member. The first regions 21 and the second region 22 may also each have a substantially circular shape, a substantially polygonal shape, or the like in a top view.

(Example of Color Adjustment of Light Emitting Module 100)

Figure 7:
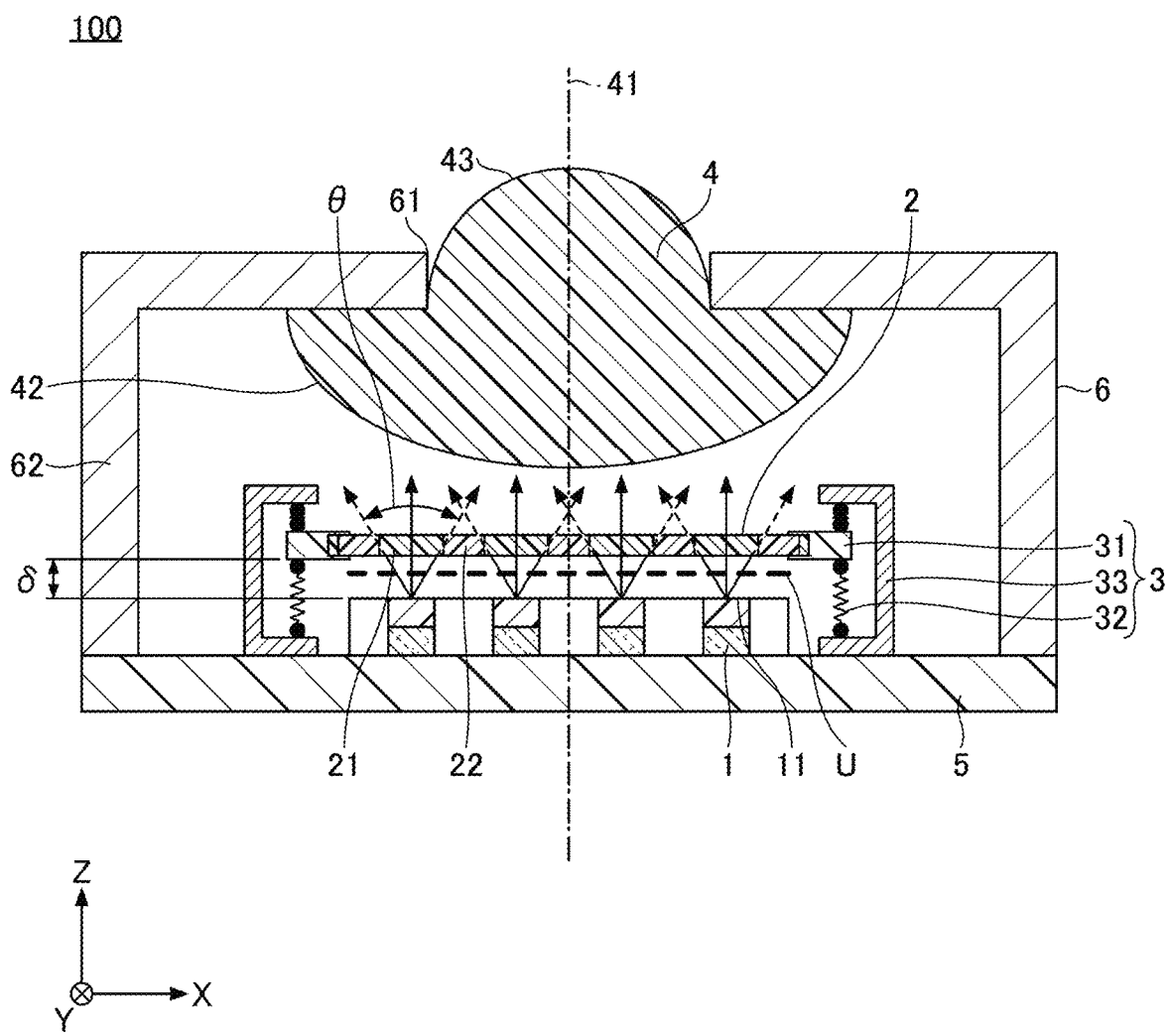
FIG. 7 is a cross-sectional view of the light emitting module of FIG. 2 after the filter is moved.
Figure 8A:
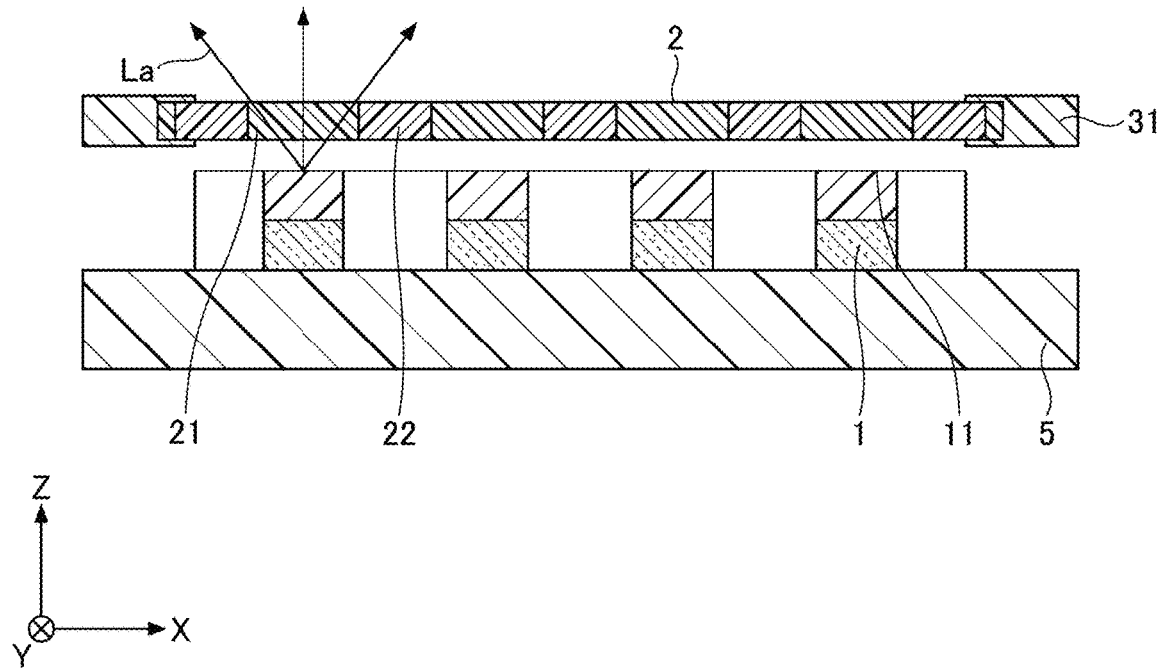
FIG. 8A is a first diagram illustrating light transmitted through the filter.
Figure 8B:
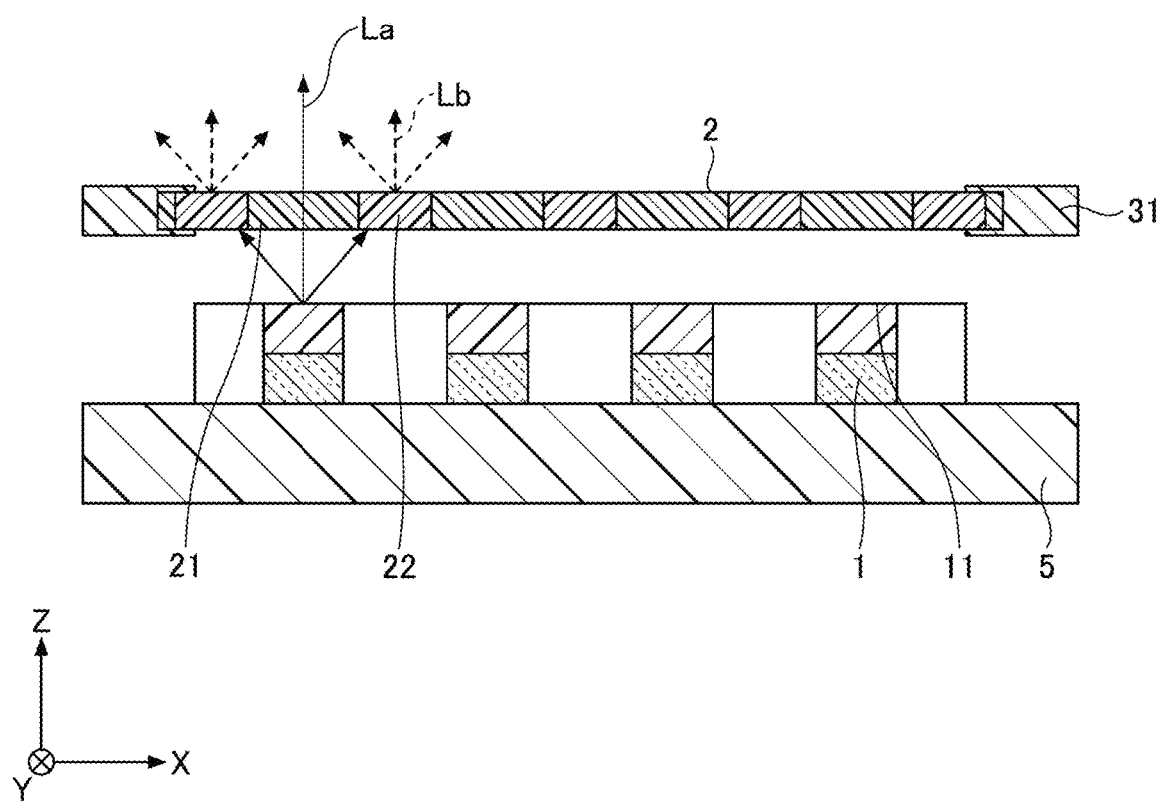
FIG. 8B is a second diagram illustrating light transmitted through the filter.

Color adjustment of the light emitting module 100 will be described with reference to FIG. 7 to FIG. 8B. FIG. 7 is a cross-sectional view of the light emitting module 100 after the filter 2 is moved. This cross-sectional view of FIG. 7 is a cross-sectional view taken through the section line I-I of FIG. 1 as in FIG. 2, and differs from FIG. 2 only in that the filter 2 is moved in the +Z direction. FIG. 8A and FIG. 8B are diagrams illustrating light transmitted through the filter 2. FIG. 8A is a first diagram and FIG. 8B is a second diagram.

As illustrated in FIG. 7, in response to the movement of the mover 31 of the change mechanism 3 in the +Z direction, the filter 2 is moved in the +Z direction from the position of the filter 2 illustrated in FIG. 2 (the position indicated by a dotted line U illustrated in FIG. 7) and is stopped. From the viewpoint of reducing color unevenness, the change mechanism 3 preferably moves the filter 2 in the +Z direction while maintaining a state in which the filter 2 is substantially parallel to the light emitting surfaces 11 of the light emitting parts 1.

In FIG. 7, a distance δ is the distance of the relative movement between the filter 2 and the light emitting parts 1 along the center axis 41 of the first lens 4. In FIG. 7, the distance of the relative movement of the surface on the −Z side of the filter 2 is set to the distance δ. A directivity half-value angle θ means a half-value angle of a spread angle of light emitted from the light emitting part 1 and propagates while spreading in the +Z direction.

The positional relationship between the filter 2 and the light emitting parts 1 along the Z direction is changed by the movement of the filter 2. Accordingly, a portion of the light emitted from the light emitting part 1 and propagates while spreading is transmitted through a corresponding first region 21, and the other portion of the light is transmitted through the second region 22 located around the first region 21 in a top view.

More specifically, as illustrated in FIG. 8A, before the filter 2 is moved, most of white light emitted from each of the light emitting parts 1 is transmitted through the first region 21, and the color of the light exiting from the filter 2 is substantially white. White light La exiting from the filter 2 is an example of light having the first chromaticity.

Conversely, as illustrated in FIG. 8B, after the filter 2 is moved in the +Z direction, the light emitted from each of the light emitting parts 1 spreads more at an incident position of the filter 2, and thus a portion of the light is incident on the first region 21 and the other portion of the light is incident on the second region 22. The light incident on the first region 21 exits from the filter 2 as white light La. The light incident on the second region 22 exits from the filter 2 as amber light Lb. The amber light Lb is an example of light having the second chromaticity.

The white light emitted from each of the light emitting parts 1 is transmitted through the first region 21 or the second region 22 of the filter 2 as the white light La or the amber light Lb. The ratio of the amount of the white light to the amount of the amber light is adjusted, and the light is emitted from the filter 2. In other words, the filter 2 can extract, from the light emitted from each of the plurality of light emitting parts 1, light (in other words, mixed light) in which the amounts of light having different colors are adjusted by allowing the light to be transmitted through the first region 21 and the second region 22. The mixed light extracted by the filter 2 exits through the first lens 4 to the +Z side.

The color of the mixed light is an intermediate color between white and amber. The ratio between the amount of the light transmitted through the first region 21 and the amount of the light transmitted through the second region 22 changes according to the position of the filter 2 in the Z direction, and thus the chromaticity of the mixed light changes. The light emitting module 100 can perform color adjustment by allowing the change mechanism 3 to change the position of the filter 2 in the Z direction such that the amounts of light having different colors can be adjusted. At least one of the first region 21 and the second region 22 of the filter 2 may include a pass-through portion through which light passes, as will be described later.

<Effects of Light Emitting Module 100>

Effects of the light emitting module 100 will be described.

The light emitting module 100 according to the present embodiment includes the plurality of light emitting parts 1. The light emitting module 100 further includes the optical member 2 (filter) including the first region 21 where light having the first chromaticity (white light La) can be extracted and the second region 22 where light having the second chromaticity (amber light Lb) can be extracted, and configured to transmit light emitted from the plurality of light emitting parts 1. The light emitting module 100 further includes the change mechanism 3 configured to change the distance between the filter 2 and the plurality of light emitting parts 1, and the first lens 4 through which light transmitted through the filter 2 exits. The change mechanism 3 is configured to change the distance between the filter 2 and the plurality of light emitting parts 1 in a direction along the center axis 41 of the first lens 4.

The filter 2 can extract, from the light emitted from the plurality of light emitting parts 1, light obtained by mixing light transmitted through the first region 21 and light transmitted through the second region 22. The change mechanism 3 can change the chromaticity of the mixed light by changing the distance between the filter 2 and the plurality of light emitting parts 1.

The color of the mixed light is changed by changing the ratio between the amount of the light transmitted through the first region 21 and the amount of the light transmitted through the second region 22 according to the position of the filter 2 in the Z direction. The light emitting module 100 can adjust the color of the light exiting through the first lens 4 by changing the position of the filter 2 in the Z direction to adjust the color of the mixed light.

In the light emitting module 100 according to the present embodiment, for example, it is not necessary to prepare a light emitting module for white light and a light emitting module for amber light, and perform color adjustment by mixing light emitted from these light emitting modules. Accordingly, the size of the entire light emitting module can be reduced and thus the cost can be reduced. Further, it is not necessary to align the positions of light from the two light emitting modules that emit light having different chromaticities.

In the present embodiment, the intermediate color between white and amber can be discretionary changed by discretionary changing the position of the filter 2 in the Z direction. Accordingly, the light emitting module 100 having a high degree of freedom in color adjustment of light can be provided.

In the present embodiment, white is exemplified as the first chromaticity and amber is exemplified as the second chromaticity; however, the first chromaticity and the second chromaticity are not limited to white and amber, and can be appropriately selected according to the use of the light emitting module 100. The light emitting module 100 can adjust a color between straight lines connecting the first chromaticity and the second chromaticity (in other words, the intermediate color between the first chromaticity and the second chromaticity) in the CIE1931 color space with a high degree of freedom.

In the present embodiment, the filter 2 includes a plurality of first regions 21, as an example, however, the configuration is not limited thereto, and the filter 2 may include at least one first region 21. Further, the filter 2 may include at least one first region 21 and a plurality of second regions 22.

Figure 9A:
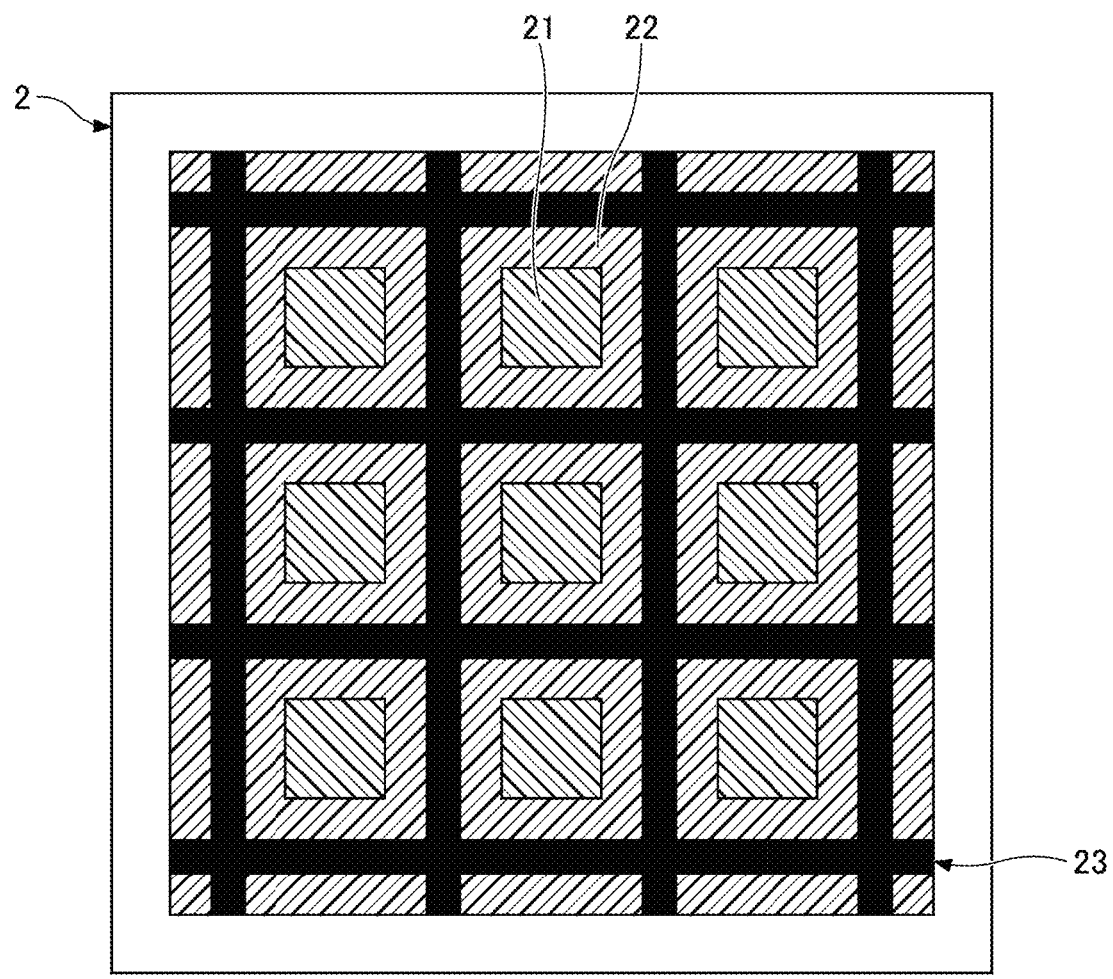
FIG. 9A is a diagram illustrating a filter including a plurality of first regions and a plurality of second regions.

The filter 2 may include a plurality of first regions 21 and a plurality of second regions 22. For example, as illustrated in FIG. 9A, in the filter 2, the plurality of second regions 22 respectively surround the plurality of first regions 21, and adjacent second regions 22 are located apart from each other by a light-shielding member 23. The light-shielding member 23 is, for example, a resin containing a light diffusion member such as titanium oxide, barium titanate, aluminum oxide, or silicon oxide; a resin containing a light absorbing member such as graphite powder; or a metal. In this manner, by independently providing one of the first regions 21 and a corresponding one of the second regions 22 with respect to each of the light emitting parts 1, propagation of light between adjacent first regions 21 and adjacent second regions 22 can be suppressed.

Figure 9B:
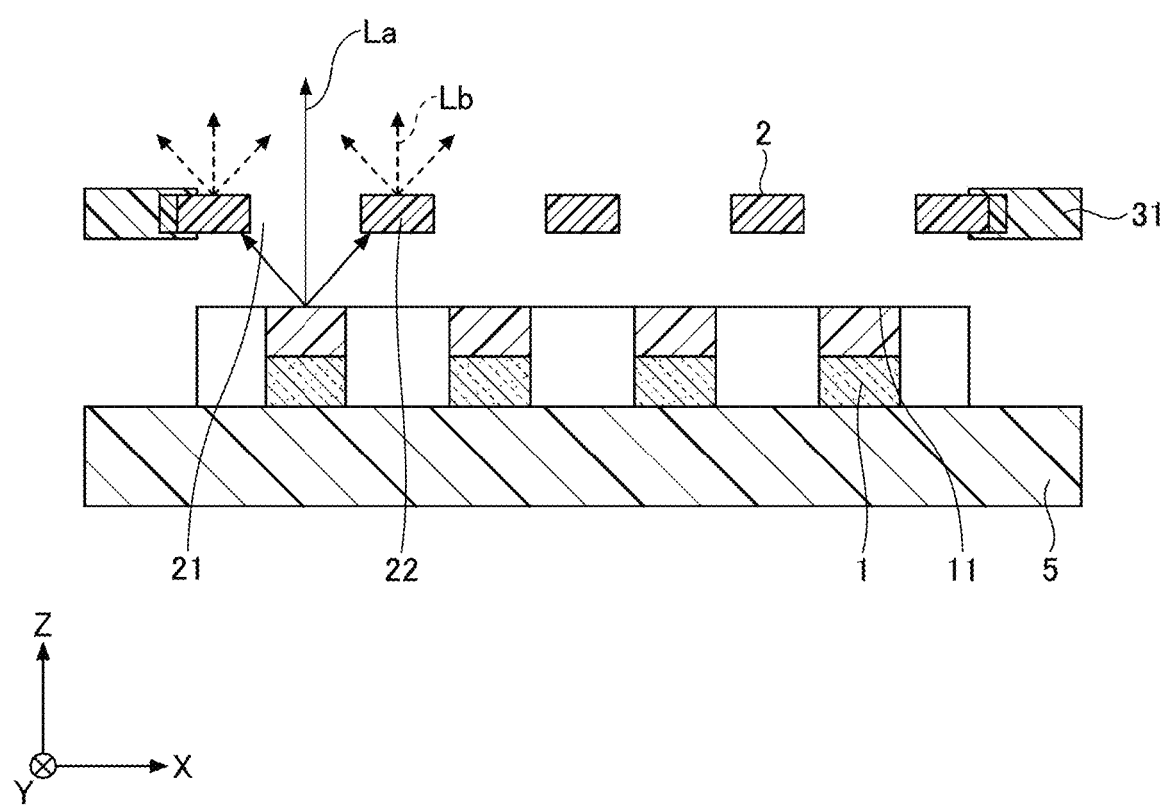
FIG. 9B is a diagram illustrating an example configuration of a filter in which first regions are through-holes.

In the present embodiment, a configuration in which light emitted from any of the light emitting parts 1 is transmitted through a first region 21 and a second region 22 of the filter 2 is exemplified. However, a configuration in which the light emitted from any of the light emitting parts 1 is transmitted through at least one of the first region 21 or the second region 22 may be adopted. For example, light may pass through a through-hole or the like formed in a region corresponding to at least one of the first region 21 or the second region 22 of the filter 2. FIG. 9B is a diagram illustrating an example configuration of a filter in which first regions 21 are through-holes. The color of light passing through the through-holes does not change, and thus, the light emitting module 100 can perform color adjustment by mixing white light passing through the through-holes and amber light transmitting through a region other than the through-holes.

Further, in the present embodiment, the plurality of light emitting parts 1 are arranged in a grid pattern, and a first region 21 is provided in one-to-one correspondence with each of the plurality of light emitting parts 1. With this configuration, the size of the light emitting module 100 can be reduced as compared to when both a first region 21 and a second region 22 are provided for each of the plurality of light emitting parts 1. A region provided in one-to-one correspondence with each of the plurality of light emitting parts 1 is not limited to the first region 21, and the same effects can be obtained when at least one of the first region 21 or the second region 22 is provided in one-to-one correspondence with each of the plurality of light emitting parts 1.

Further, in the present embodiment, a position at which a light emitting part 1 of the plurality of light emitting parts 1 is disposed and an irradiation position irradiated with light emitted from the light emitting part 1 through the first lens 4 are point-symmetric with respect to the center axis of the first lens 4 in a top view. With this configuration, the light emitting module 100 can reduce shading of the light allowed by the first lens 4.

Further, in the present embodiment, the second region 22 is provided around the first region 21 in a top view. With this configuration, the white light La passing through the first region 21 is mixed with the amber light Lb transmitted through the second region 22 provided around the first region 21 in a top view. Therefore, the light emitting module 100 can suppress color unevenness of the mixed light and obtain color-adjusted light with good uniformity.

Further, in the present embodiment, the plurality of light emitting parts 1 each have the light emitting surface 11 and are arranged at equal intervals along the X direction. The filter 2 includes a plurality of first regions 21 provided in one-to-one correspondence with the light emitting surfaces 11 of the plurality of light emitting parts 1. The light emitting surfaces 11 are each located inward of a corresponding one of the first regions 21 in a top view. The change mechanism 3 changes the distance between the filter 2 and the light emitting parts 1 by causing a relative movement between the filter 2 and the light emitting parts 1 along the center axis 41 of the first lens 4. A preferable distance $\delta_1$ of the relative movement between the filter 2 and the light emitting parts 1 is represented by Formula (1) below (see FIG. 7 for the distance δ and the directivity half-value angle θ, and see FIG. 3 for the distance d).

Formula (1)

$$0 < \delta_1 \leq \frac{d}{2 \cdot \tan(\theta/2)} \quad (1)$$

Figure 10A:
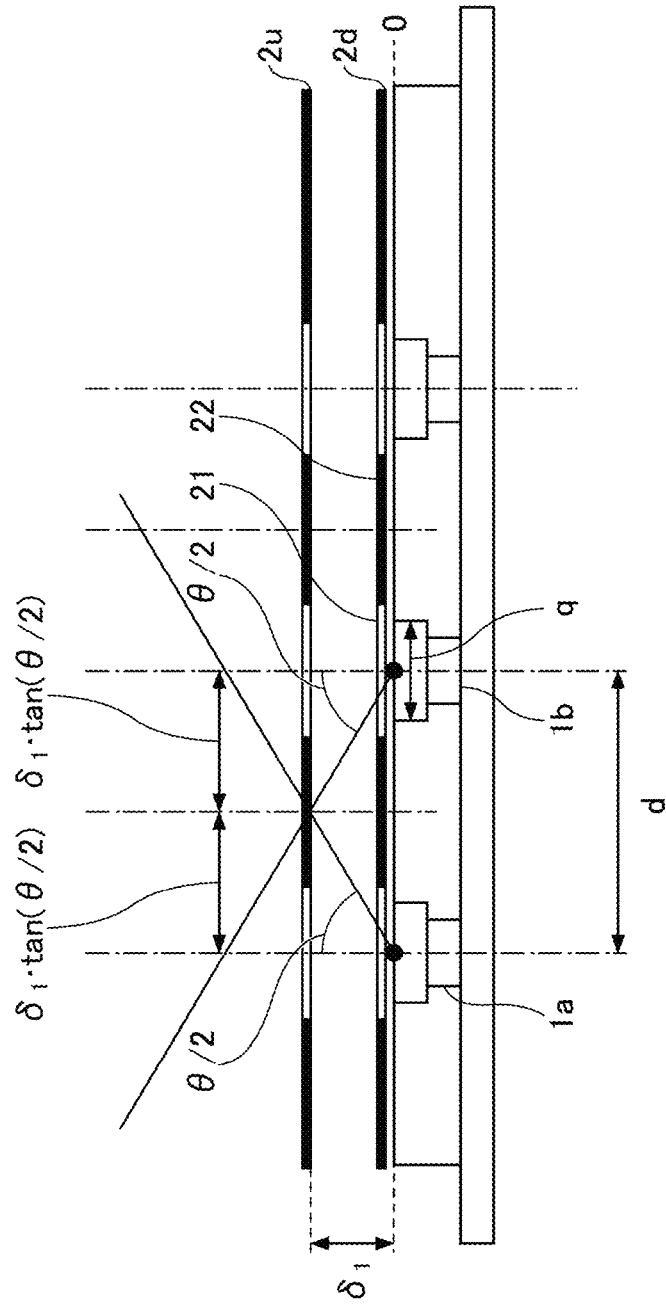
FIG. 10A is a diagram illustrating the relationship among a distance d, a distance $\delta_1$, and a directivity half-value angle $\theta$.

FIG. 10A is a diagram illustrating the relationship among the distance d, the distance $\delta_1$, and the directivity half-value angle θ. As illustrated in FIG. 3 and FIG. 10A, the centers of the adjacent light emitting parts 1a and 1b are located apart from each other by the distance d along the X direction. A lower surface 2d of the filter represents a surface on the −Z side of the filter 2 before the filter 2 is moved, and a lower surface 2u of the filter represents a surface on the −Z side of the filter 2 after the filter 2 is moved. More specifically, the distance $\delta_1$ is the distance between the lower surface of the filter 2 and the light emitting surfaces 11 of the light emitting parts 1.

When the distances $\delta_1$ of the relative movement between the filter 2 and the light emitting parts 1 is represented by Formula (1) above, positions where light emitted from the adjacent light emitting parts 1a and 1b are incident on the filter 2 do not overlap each other before and after the filter 2 is moved. Thus, the light emitting module 100 can improve the contrast of the light emitted from the adjacent light emitting parts 1a and 1b. Accordingly, for example, in a case where partial irradiation is performed, the contrast of partial irradiation light can be improved. Note that "partial irradiation" means that some regions, among regions that can be irradiated with light by the light emitting module 100, that is, among regions that can be irradiated with light when the light is emitted from all of the plurality of light emitting parts 1, are partially irradiated with light by allowing some of the plurality of light emitting parts 1 to emit the light. Further, "contrast" refers to the level of contrast, which is the difference in brightness between a region that is irradiated with light and a region that is not irradiated with light.

Figure 10B:
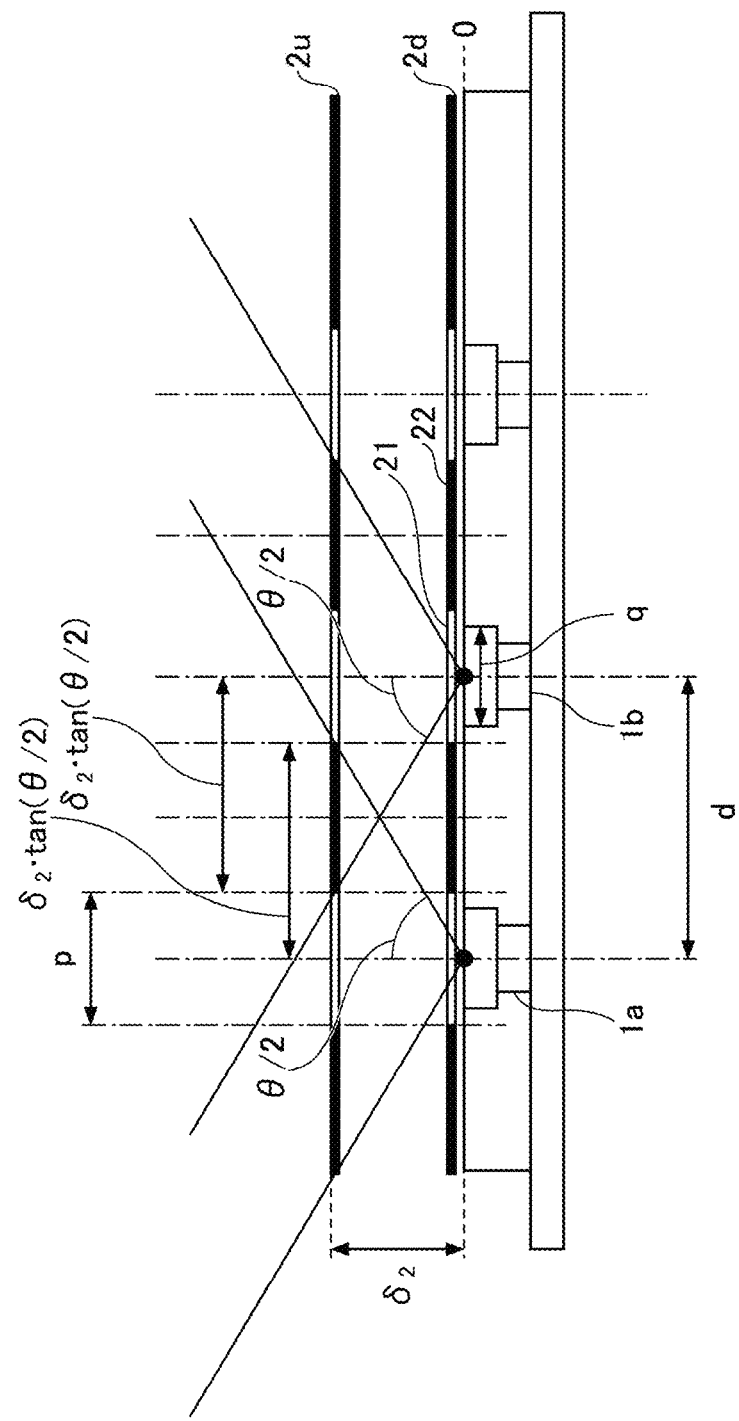
FIG. 10B is a diagram illustrating the relationship among the distance d, a distance $\delta_2$, the directivity half-value angle $\theta$, and a region width p.

Another preferable distance $\delta_2$ of the relative movement between the filter 2 and the light emitting parts 1 may be represented by Formula (2) below (see FIG. 5 for the light emitting surface width q of each of the light emitting surfaces 11). FIG. 10B is a diagram illustrating the relationship among the distance d, the distance $\delta_2$, and the directivity half-value angle θ, and the region width p of each of the first regions 21. The distance $\delta_2$ is the distance between the lower surface of the filter 2 and the light emitting surfaces 11 of the light emitting parts 1.

Formula (2)

$$0 < \delta_2 \leq \frac{2 \cdot d - p}{2 \cdot \tan(\theta/2)} \quad (2)$$

When the distance $\delta_2$ of the relative movement is represented by Formula (2) above, the light emitting module 100 can increase the amount of light transmitted through the second region 22 such that the range of color adjustment can be broadened and a dark line and a dark portion in the irradiation region S can be made inconspicuous. The dark line means a dark linear region in the irradiation region S, and the dark portion means a dark two-dimensional region in the irradiation region S.

In the present embodiment, a configuration in which the first regions 21 include the transmitting portions is exemplified, however, the first regions 21 may include at least one of a color filter that transmits light having a given wavelength of light emitted from the light emitting parts 1 or a wavelength conversion substance that converts light emitted from the light emitting parts 1 into light having a given wavelength. Further, in the present embodiment, a configuration in which the second region 22 includes a color filter is exemplified, however, the second region 22 may include at least one of a transmitting portion that transmits light emitted from the light emitting parts 1 or a wavelength conversion substance that converts light emitted from the light emitting parts 1 into light having a different wavelength from the above given wavelength. With such a configuration, the effects the same as or similar to those of the light emitting module 100 can be provided.

Second Embodiment

A light emitting module 100a according to a second embodiment will be described. The same names and reference numerals as those of the first embodiment denote the same or similar members, and a detailed description thereof will not be repeated as appropriate. The same applies to embodiments and modifications described later.

Figure 11:
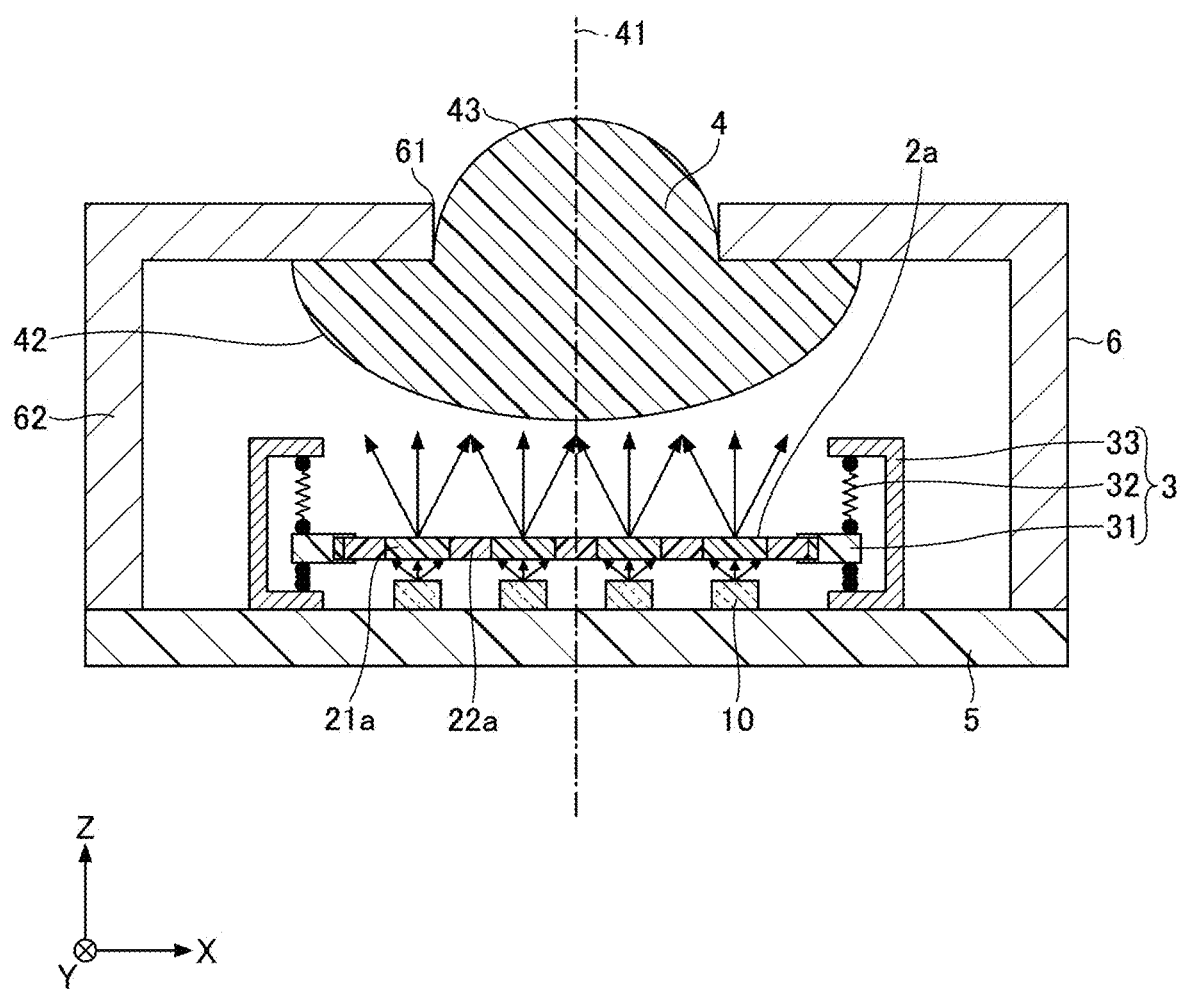
FIG. 11 is a cross-sectional view illustrating the configuration of a light emitting module according to a second embodiment.

FIG. 11 is a cross-sectional view illustrating the configuration of the light emitting module 100a.

As illustrated in FIG. 11, the light emitting module 100a includes a plurality of light emitting parts 10 and an optical member 2a. The light emitting parts 10 are mounted on the surface on the +Z side of the light-emitting-part mounting substrate 5. The plurality of light emitting parts 10 are arranged in a grid pattern along the X direction and the Y direction. In the present embodiment, the light emitting module 100a in which light emitting elements emitting blue light are used as the light emitting parts 10 and a wavelength conversion member is used as the optical member 2a will be described as an example.

Note that various types of light sources such as xenon lamps can be utilized for the light emitting parts 10 of the light emitting module 100a. However, in order to efficiently excite a wavelength conversion substance contained in a wavelength conversion member 2a, light emitting elements such as LEDs that emit light of a short wavelength are preferable.

The wavelength conversion member 2a has a first region 21a where light having a first chromaticity can be extracted and a second region 22a where light having a second chromaticity different from the first chromaticity can be extracted. The wavelength conversion member 2a is an example of an optical member that transmits light emitted from the plurality of light emitting parts 10.

The wavelength conversion member 2a is provided on the +Z side of the plurality of light emitting parts 10, and is fixed to the inner side of the mover 31. The change mechanism 3 can move the wavelength conversion member 2a along the Z direction by moving the mover 31 along the Z-axis to change the distance between the wavelength conversion member 2a and each of the plurality of light emitting parts 10 along the Z direction.

In the present embodiment, a plurality of first regions 21a are provided in one-to-one correspondence with the plurality of light emitting parts 10, however, the configuration is not limited thereto. At least one of first regions 21a or second regions 22a may be provided in one-to-one correspondence with the plurality of light emitting parts 10.

In the state illustrated in FIG. 11, after light emitted from each of the plurality of light emitting parts 10 is transmitted through a corresponding one of the first regions 21a, the light is incident on the first lens 4 provided on the +Z side of the wavelength conversion member 2a. Most of the light emitted from each of the plurality of light emitting parts 10 is not incident on the second region 22a of the wavelength conversion member 2a and thus is not transmitted through the second region 22a.

The first regions 21a are a plurality of regions formed in a substantially rectangular shape in a top view. Each of the first regions 21a includes a wavelength conversion substance that converts light emitted from the corresponding light emitting part 10 into light having a first wavelength. The first regions 21a can extract, as the light having the first chromaticity, mixed light in which the light having the first wavelength converted by the wavelength conversion substance and the light emitted from the corresponding light emitting part 10 are mixed. In the present embodiment, the first regions 21a extract white light as the light having the first chromaticity.

The second region 22a is a region provided around each of the first regions 21a of the wavelength conversion member 2a in a top view. The second region 22a includes a wavelength conversion substance that converts the light emitted from the light emitting parts 10 into light having a second wavelength. The second region 22a can extract, as the light having the second chromaticity, mixed light in which the light having the second wavelength converted by the wavelength conversion substance and the light emitted from the light emitting parts 10 are mixed. In the present embodiment, the second region 22a extracts amber light as the light having the second chromaticity.

A wavelength conversion member included in each of the first regions 21a and the second region 22a may be a member in which a wavelength conversion substance as described above is contained in a base member, for example, a resin such as silicone, glass, ceramic, or the like, may be a member in which the wavelength conversion substance is printed on the surface of a formed body, for example, glass, or may be a sintered body of the wavelength conversion substance.

Figure 12:
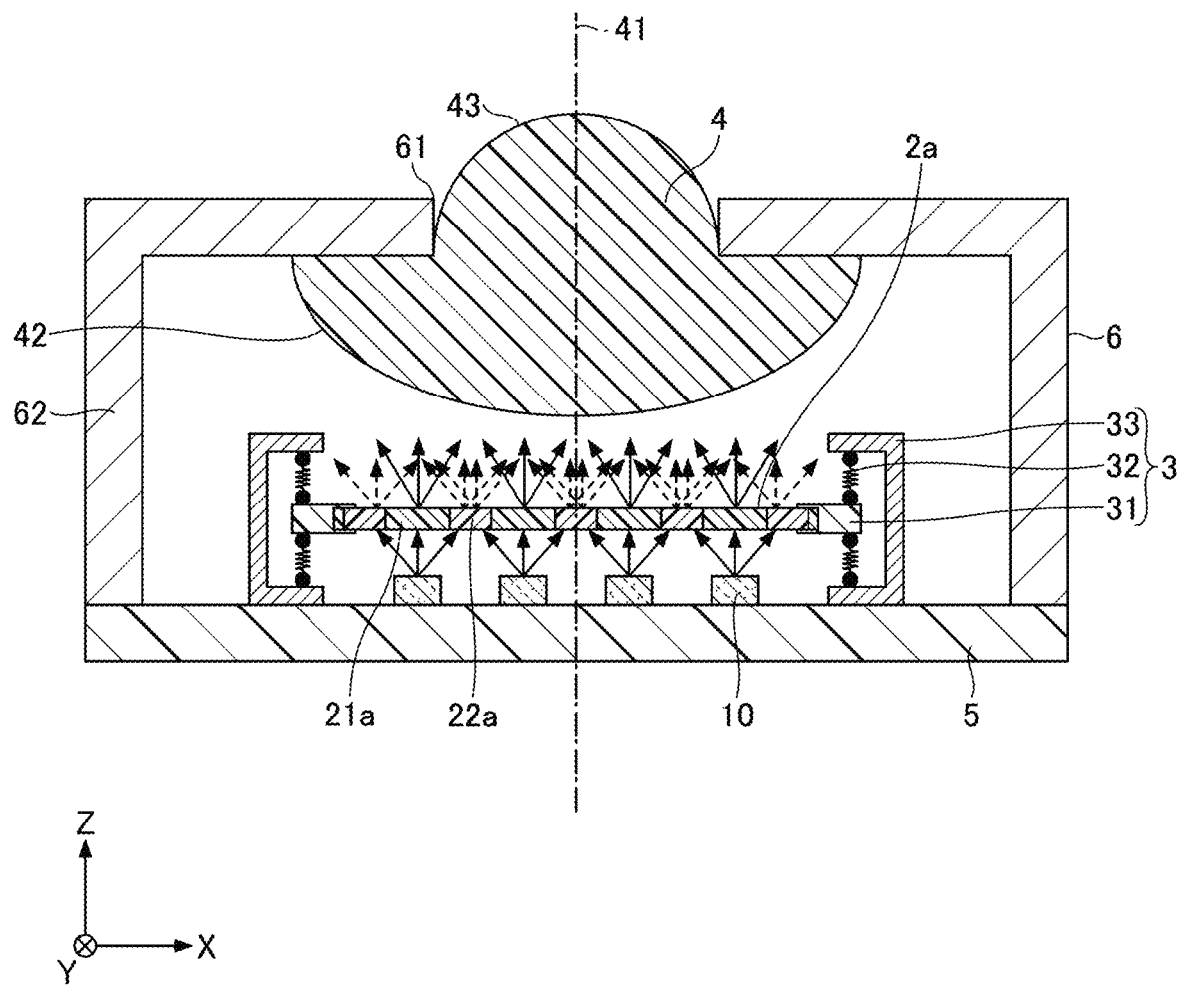
FIG. 12 is a cross-sectional view illustrating the light emitting module after a wavelength conversion member is moved.

FIG. 12 is a cross-sectional view illustrating the light emitting module 100a after the wavelength conversion member 2a is moved. In response to the movement of the mover 31 of the change mechanism 3 in the +Z direction, the wavelength conversion member 2a is moved in the +Z direction from the position of the wavelength conversion member 2a illustrated in FIG. 11 and is stopped.

The positional relationship between the wavelength conversion member 2a and the light emitting parts 10 along the Z direction is changed by the movement of the wavelength conversion member 2a. Accordingly, a portion of the light that is emitted from each of the light emitting parts 10 and propagates while spreading is transmitted through a corresponding first region 21a, and the other portion of the light is transmitted through the second region 22a.

In other words, the wavelength conversion member 2a can extract, of the light emitted from each of the plurality of light emitting parts 10, light in which the ratio of the amounts of light of different colors is adjusted by allowing the light to be transmitted through the first region 21a and the second region 22a. The light in which the amounts of the light of the different colors are adjusted (in other words, the mixed light), which is extracted by the wavelength conversion member 2a, is emitted to the +Z side through the first lens 4.

The color of the mixed light is an intermediate color between white and amber. The ratio between the amount of the light transmitted through the first region 21a and the amount of the light transmitted through the second region 22a changes according to the position of the wavelength conversion member 2a in the Z direction, and thus the chromaticity of the mixed light changes. The light emitting module 100a can perform color adjustment by allowing the change mechanism 3 to change the position of the wavelength conversion member 2a in the Z direction such that the amounts of light having different colors are adjusted. At least one of the first region 21a and the second region 22a may include a pass-through portion.

In the present embodiment, white is exemplified as the first chromaticity and amber is exemplified as the second chromaticity, however, the first chromaticity and the second chromaticity are not limited to white and amber, and can be appropriately selected according to the use of the light emitting module 100a. The light emitting module 100a can adjust a color between straight lines connecting the first chromaticity and the second chromaticity (in other words, the intermediate color between the first chromaticity and the second chromaticity) in the CIE1931 color space with a high degree of freedom.

Effects of the light emitting module 100a are the same as or similar to those of the light emitting module 100 according to the first embodiment.

(Modification)

Figure 13:
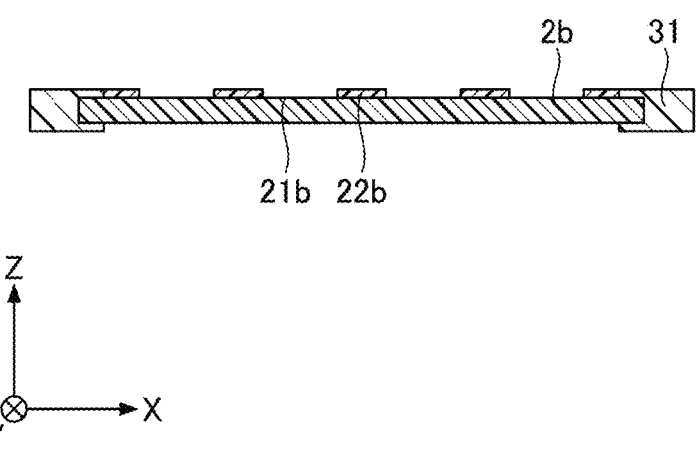
FIG. 13 is a cross-sectional view illustrating the configuration of a wavelength conversion member according to a modification.

FIG. 13 is a cross-sectional view illustrating the configuration of an optical member 2b according to a modification. A wavelength conversion member, which is the optical member 2b, includes a first region 21b where light having a first chromaticity can be extracted and a second region 22b where light having a second chromaticity different from the first chromaticity can be extracted.

A plurality of first regions 21b are a plurality of regions arranged in a grid pattern along the X direction and the Y direction, for example, and are formed in a substantially rectangular shape in a top view. The second region 22b is provided around each of the plurality of first regions 21b in a top view. That is, the second region 22b extends linearly along the X direction and the Y direction, and has an intersection surrounded by four first regions 21b adjacent to each other in the X direction and the Y direction.

A wavelength conversion member 2b is a light-transmissive plate-shaped member including, as base material, a resin material such as polycarbonate or a glass material. A color conversion member such as a paint, a pigment, or a color filter is provided on the surface on the +Z side of the wavelength conversion member 2b. A region where the color conversion member is provided corresponds to the second region 22b. Conversely, regions where the color conversion member is not provided and the base material of the wavelength conversion member 2b is exposed correspond to the first regions 21b. The base material of the wavelength conversion member 2b may include a wavelength conversion substance or the like that converts the wavelength of light emitted from the light emitting parts 1.

The light emitting module 100a or the light emitting module 100 can perform color adjustment by allowing the change mechanism 3 to change the position of the wavelength conversion member 2b in the Z direction to adjust the color of mixed light. Effects of the light emitting module 100 and the light emitting module 100a that include the wavelength conversion member 2b are the same as the above-described effects.

Third Embodiment

FIG. 14 is a cross-sectional view illustrating the configuration of a light emitting module 100c according to a third embodiment. The light emitting module 100c further includes a plurality of second lenses 7.

The plurality of second lenses 7 are provided between the filter 2 and the first lens 4 such that the plurality of second lenses 7 are in one-to-one correspondence with the plurality of light emitting parts 1. The plurality of second lenses 7 are arranged in a grid pattern along the X direction and the Y direction, and overlap the plurality of light emitting parts 1 in a top view. The plurality of second lenses 7 according to the present embodiment are total internal reflection (TIR) lenses each including a total reflection portion on the side closer to the light emitting parts 1. The number of the plurality of second lenses 7, the diameter, the radius of curvature, the shape of each of the second lenses 7, and the like can be appropriately selected according to the use of the light emitting module 100c.

The plurality of second lenses 7 are optically transmissive to light emitted from the light emitting parts 1. The plurality of second lenses 7 includes at least one of a resin material, such as a polycarbonate resin, an acrylic resin, a silicone resin, a modified silicone resin, an epoxy resin, or a modified epoxy resin, or a glass material. As used herein, "optically transmissive" refers to a property that allows 60% or more of the light from each of the light emitting parts 1 to be transmitted. In the present embodiment, the plurality of second lenses 7 are produced by injection molding of a resin material such that adjacent second lenses 7 are continuously and integrally formed. However, the plurality of second lenses 7 may be separated from each other. Further, a method of producing the second lenses 7 is not limited to injection molding of a resin material, and a method of cutting a resin or a glass material may be used.

The change mechanism 3 integrally moves the filter 2 and the plurality of second lenses 7 in a direction along the center axis 41 of the first lens 4. Note that integrally moving the plurality of second lenses 7 and the filter 2 includes both cases of moving the plurality of second lenses 7 and the filter 2 in a state in which the plurality of second lenses 7 and the filter 2 are located apart from each other and moving the plurality of second lenses 7 and the filter 2 in a state in which the plurality of second lenses 7 and the filter 2 are in contact with each other.

Figure 15:
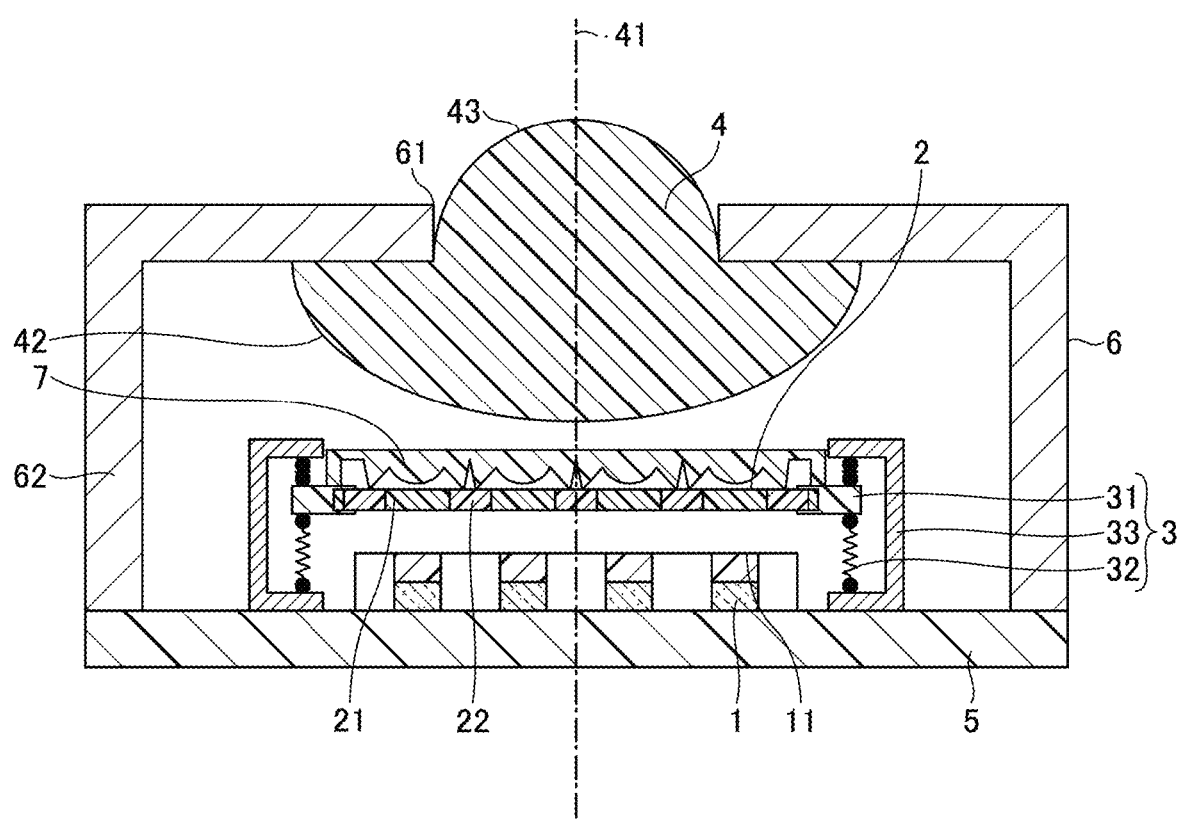
FIG. 15 is a cross-sectional view illustrating the light emitting module of FIG. 14 after a filter and a plurality of second lenses are integrally moved.

FIG. 15 is a cross-sectional view illustrating the light emitting module 100c after the filter 2 and the plurality of second lenses 7 are integrally moved. In response to the movement of the mover 31 of the change mechanism 3 in the +Z direction, the filter 2 is moved in the +Z direction from the position of the filter 2 illustrated in FIG. 14 and is stopped.

The positional relationship between the filter 2 and the light emitting parts 1 along the Z direction is changed by the movement of the filter 2. Accordingly, a portion of light emitted from each of the light emitting parts 1 and propagating while spreading is transmitted through a corresponding first region 21 including a transmitting portion, and the other portion of the light is transmitted through the second region 22.

Figure 16A:
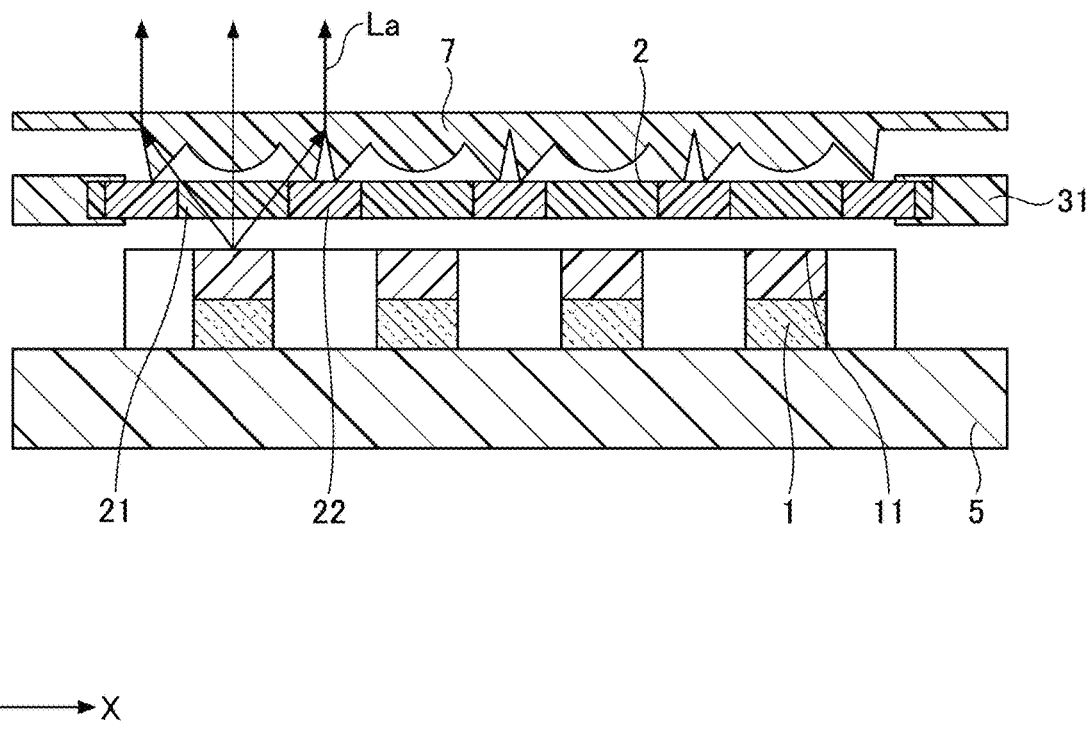
FIG. 16A is a first diagram illustrating light transmitted through the filter and the plurality of second lenses.
Figure 16B:
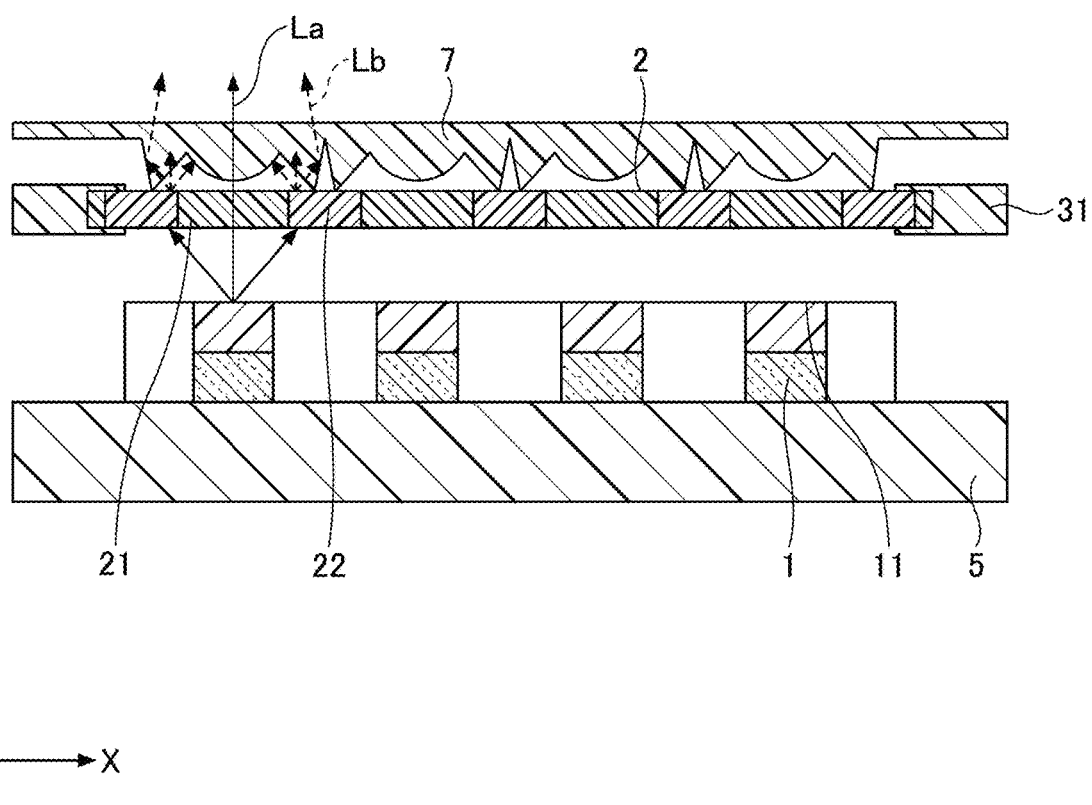
FIG. 16B is a second diagram illustrating light transmitted through the filter and the plurality of second lenses.

FIG. 16A and FIG. 16B are diagrams illustrating light transmitted through the filter 2 and the plurality of second lenses 7. FIG. 16A is a first diagram and FIG. 16B is a second diagram. As illustrated in FIG. 16A, before the filter 2 and the plurality of second lenses 7 are integrally moved, most of white light emitted from each of the light emitting parts 1 is incident on a corresponding first region 21 including a transmitting portion and is transmitted through the first region 21. Thus, light exiting through the filter 2 is substantially white light. Further, the light exiting through the filter 2 is incident on a corresponding second lens 7 of the plurality of second lenses 7, and after restriction of the spread of the angle by the second lens 7, the light exits through the second lens 7.

Conversely, as illustrated in FIG. 16B, after the filter 2 is moved in the +Z direction, light emitted from each of the light emitting parts 1 spreads more at a position where the light is incident on the filter 2. Thus, a portion of the light is incident on the first region 21 and the other portion of the light is incident on the second region 22. The light incident on the first region 21 exits through the filter 2 as white light La. The light incident on the second region 22 exits through the filter 2 as amber light Lb. Further, the light exiting through the filter 2 is incident on the second lens 7, and after restriction of the spread of the angle by the second lens 7, the light exits through the second lens 7.

The positional relationship between the filter 2 and the plurality of second lenses 7 does not change before and after the filter 2 is moved. That is, the change mechanism 3 integrally moves the filter 2 and the plurality of second lenses 7, and thus a spread angle of light transmitted or passing through the filter 2 and exiting through each of the second lenses 7 does not substantially change before and after the movement. The white light La and the amber light Lb are mixed after exiting each of the second lenses 7. The mixed light is emitted to the +Z side through the first lens 4.

The color of the mixed light is changed by changing the ratio between the amount of the light transmitted through the first region 21 and the amount of the light transmitted through the second region 22 according to the positions of the filter 2 and the second lenses 7 in the Z direction. The light emitting module 100c can perform color adjustment by allowing the change mechanism 3 to change the positions of the filter 2 and the second lenses 7 in the Z direction to change the color of the mixed light.

The light emitting module 100c includes the second lenses 7 between the filter 2 and the first lens 4, and thus can suppress spread of light transmitted through the filter 2, as compared to when the second lenses 7 are not included. Accordingly, mixed light exiting through one second lens 7 can be suppressed from being mixed with another mixed light exiting through an adjacent second lens 7, for example. As a result, the light emitting module 100c can obtain color-adjusted light with less color unevenness. Other effects of the light emitting module 100c are the same as or similar to those of the first embodiment.

In the present embodiment, a configuration in which the change mechanism 3 integrally moves the filter 2 and the second lenses 7 in the Z direction is exemplified, however, the configuration is not limited thereto. For example, the second lenses 7 may be movable in the Z direction independently of the filter 2 by another change mechanism that is different from the change mechanism 3.

In the present embodiment, a configuration in which the light emitting module 100c includes the filter 2 is exemplified, however, the light emitting module 100c may include the wavelength conversion member 2a or the wavelength conversion member 2b instead of the filter 2.

Fourth Embodiment

FIG. 17 is a cross-sectional view illustrating the configuration of a light emitting module 100d according to a fourth embodiment. The light emitting module 100d further includes a diffusion plate 8 and a first lens moving mechanism 9.

The diffusion plate 8 diffuses light emitted from the light emitting parts 1 and transmitted or passing through the filter 2 and the second lenses 7. The diffusion plate 8 is a light-transmissive plate-shaped member including, for example, glass or a resin. Projections and recesses each having a width or a height substantially equal to the wavelength of light may be formed on the surface of the diffusion plate 8.

The first lens moving mechanism 9 is an example of a moving mechanism that causes a relative movement between the first lens 4 and the plurality of light emitting parts 1 along a direction intersecting the center axis 41 of the first lens 4. In the present embodiment, the first lens moving mechanism 9 causes a relative movement between the first lens 4 and the plurality of light emitting parts 1 along the X direction that is substantially orthogonal to the center axis 41, however, the configuration is not limited thereto. The first lens moving mechanism 9 may cause a relative movement between the first lens 4 and the plurality of light emitting parts 1 along the Y direction, or may cause a relative movement between the first lens 4 and the plurality of light emitting parts 1 along both of the X direction and the Y direction. In the present embodiment, the direction intersecting the center axis 41 is preferably substantially orthogonal to the center axis 41, and is a direction having an inclination within a range of ±10° with respect to the center axis 41.

The first lens moving mechanism 9 includes a drive unit such as a voice coil motor or a supersonic motor. Further, the first lens moving mechanism 9 has an opening at substantially the center thereof. The opening has a substantially circular shape in a top view. The first lens moving mechanism 9 can move the first lens 4 held within the opening by driving the voice coil motor, the supersonic motor, or the like.

Light emitted to the +Z side through the first lens 4 is transmitted through a transparent member 63, which is provided in the housing 6 to face the first lens 4, and is emitted to the +Z side of the light emitting module 100d.

The light emitting module 100d adjusts the color of light by using the filter 2 and diffuses the color-adjusted light by the diffusion plate 8 to decrease the directivity of the light. Accordingly, color unevenness of the color-adjusted light can be suppressed. Further, the light emitting module 100d can change the irradiation direction and the irradiation position of the color-adjusted light by allowing the first lens moving mechanism 9 to move the first lens 4. Other effects are the same as or similar to those of the light emitting module 100.

Fifth Embodiment

Figure 18:
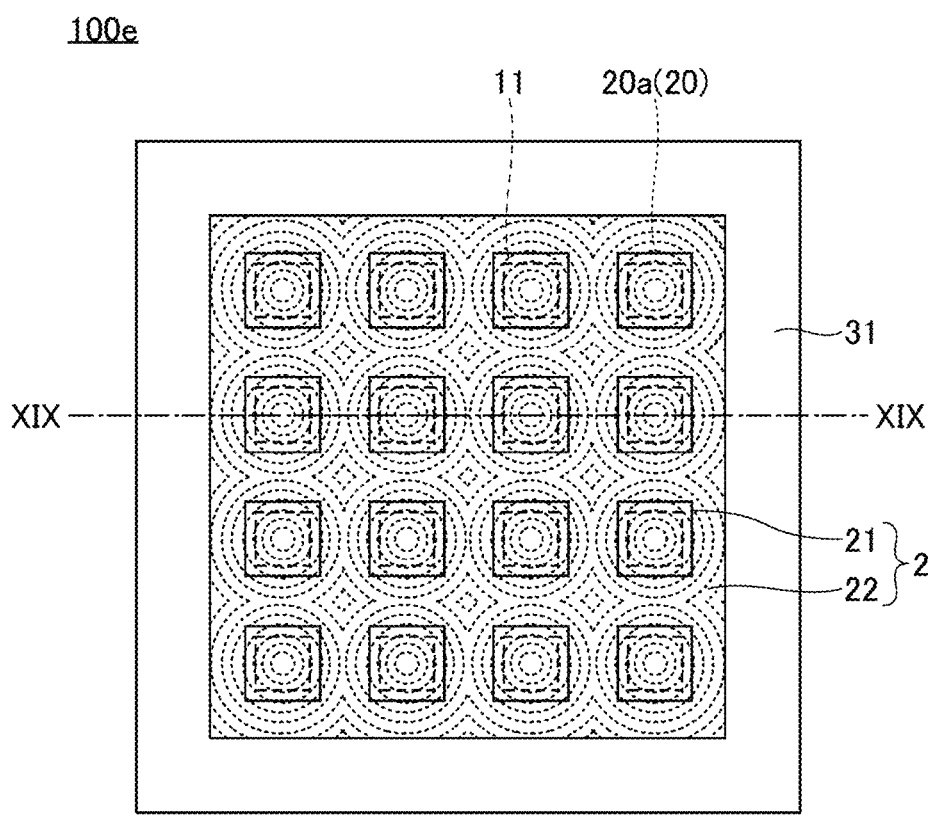
FIG. 18 is a cross-sectional view illustrating the configuration of a light emitting module according to a fifth embodiment.
Figure 19:
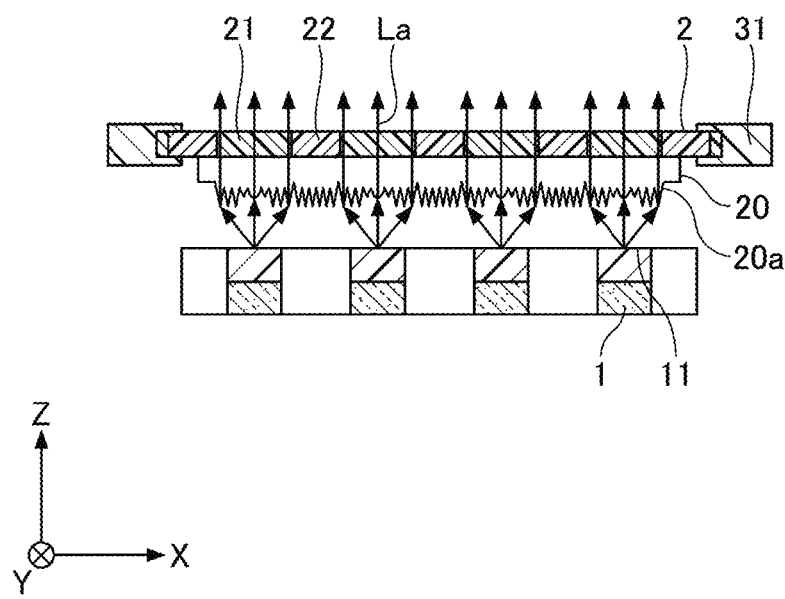
FIG. 19 is a cross-sectional view taken through section line XIX-XIX of FIG. 18.

A light emitting module 100e according to a fifth embodiment will be described with reference to FIG. 18 and FIG. 19. FIG. 18 and FIG. 19 are diagrams illustrating the configuration of a third lens 20 included in the light emitting module 100e. FIG. 18 is a top view, and FIG. 19 is a cross-sectional view taken through section line XIX-XIX of FIG. 18. In FIG. 18 and FIG. 19, only the components around the filter 2 are illustrated for convenience of description.

The third lens 20 includes a plurality of light distribution parts 20a. In the present embodiment, the third lens 20 is a substantially plate-shaped member, and the third lens 20 is disposed such that the surface on the +Z side of the third lens 20 is in contact with the surface on the −Z side of the filter 2. However, the third lens 20 does not have to be in contact with the filter 2, and an air layer, an adhesive, or the like may be interposed between the third lens 20 and the filter 2.

The light distribution parts 20a are provided between the filter 2 and the plurality of light emitting parts 1, overlap the plurality of light emitting parts 1 in a top view, and are arranged in one-to-one correspondence with the plurality of light emitting parts 1. Each of the plurality of light distribution parts 20a defines the distribution of light from a corresponding one of the light emitting parts 1. The light distribution parts 20a are provided on the −Z side of the third lens 20. For example, each of the light distribution parts 20a is a Fresnel lens part in which a convex or concave lens shape is divided into concentric regions, and the cross section has a sawtooth shape. In the present embodiment, the third lens 20 is a substantially plate-shaped member, and includes the light distribution parts 20a, which are Fresnel lens parts, on the surface on the light emitting part 1 side of the substantially plate-shaped member.

The change mechanism 3 holds the third lens 20 on the inner side of the mover 31 in a top view, and integrally moves the filter 2 and the third lens 20 including the plurality of light distribution parts 20a in a direction along the center axis 41 of the first lens 4 by moving the mover 31 in the direction along the center axis 41 of the first lens 4. FIG. 19 illustrates a state in which the filter 2 and the third lens 20 are closest to the plurality of light emitting parts. The shortest distance between the third lens 20 and the plurality of light emitting parts 1 is, for example, 50 μm or more and 200 μm or less. The change mechanism 3 can integrally move the filter 2 and the third lens 20 to the +Z side from the state of FIG. 19.

Light emitted from each of the plurality of light emitting parts 1 propagates in the +Z direction while spreading, and is incident on a corresponding one of the plurality of light distribution parts 20a. Each of the plurality of light distribution parts 20a suppresses a spread of incident light and converts the incident light into light close to parallel light. The light from the each of the plurality of light distribution parts 20a is transmitted or passes through the filter 2, and then emitted to the +Z side.

The change mechanism 3 integrally moves the filter 2 and the third lens 20, and thus a spread angle of the light incident on the third lens 20 and transmitted or passing through the filter 2 does not substantially change before and after the movement.

The color of mixed light is changed by changing the ratio between the amount of the light transmitted or passing through the first region 21 and the amount of the light transmitted or passing through the second region 22 according to the positions of the filter 2 and the third lens 20 in the Z direction. The light emitting module 100e can perform color adjustment by allowing the change mechanism 3 to change the positions of the filter 2 and the third lens 20 in the Z direction to adjust a mixed color.

The light emitting module 100e includes the third lens 20, including the light distribution parts 20a, between the filter 2 and the light emitting parts 1. Thus, as compared to when the third lens 20 is not included, the light emitting module 100e can suppress a spread of light before the light is transmitted or passing through the filter 2, thereby obtaining light close to parallel light. Accordingly, mixed color light emitted from a predetermined region of the filter 2 is less likely to be mixed with other mixed color light such as mixed color light emitted from a region around the predetermined region. As a result, the light emitting module 100e can obtain color-adjusted light with less color unevenness. Other effects of the light emitting module 100e are the same as or similar to those of the first embodiment.

In the present embodiment, a configuration in which the filter 2 and the third lens 20 are integrally moved in the Z direction by the change mechanism 3 is exemplified, however, the configuration is not limited thereto. For example, the third lens 20 may be movable in the Z direction independently of the filter 2 by another change mechanism that is different from the change mechanism 3. Further, a configuration in which the third lens 20 includes the plurality of light distribution parts 20a on the surface opposite to the surface facing the filter 2 is exemplified, however, the third lens 20 may include the plurality of light distribution parts 20a on the surface facing the filter 2 (in other words, the surface on the +Z side of the third lens 20).

In the present embodiment, a configuration in which the light emitting module 100e includes the filter 2 is exemplified, however, the light emitting module 100e may include the wavelength conversion member 2a or the wavelength conversion member 2b instead of the filter 2.

Although preferred embodiments and the like have been described in detail above, these embodiments and the like are non-limiting examples, and various modifications and substitutions may be made to the above-described embodiments and the like without departing from the scope recited in the claims.

The light emitting modules according to the present invention can be suitably used for lighting, camera flashes, vehicle headlights, and the like. However, the application of the light emitting modules according to the present invention is not limited to these applications.

Aspects of the present disclosure are as follows, for example.

<Clause 1> A light emitting module comprising:
  a plurality of light emitting parts;
  an optical member including a first region where light having a first chromaticity is extracted and a second region where light having a second chromaticity different from the first chromaticity is extracted, and configured to transmit or pass light emitted from the plurality of light emitting parts;
  a change mechanism configured to change a distance between the optical member and the plurality of light emitting parts in a direction along a center axis of the first lens; and
  a first lens on which light transmitted or passing through the optical member is incident, wherein
    the first region or the second region is provided so as to correspond to one of the plurality of light emitting parts.

<Clause 2> The light emitting module according to clause 1, wherein the plurality of light emitting parts are arranged in a grid pattern.

<Clause 3> The light emitting module according to clause 1 or 2, further comprising:
  a moving mechanism configured to cause a relative movement between the first lens and the plurality of light emitting parts along a direction intersecting the center axis of the first lens.

<Clause 4> The light emitting module according to any one of clauses 1 to 3, wherein
  the optical member is configured to extract, of the light emitted from the plurality of light emitting parts, light in which a ratio of an amount of light transmitted or passing through the first region to an amount of light transmitted or passing through the second region is adjusted, and
  the change mechanism changes the distance between the optical member and the plurality of light emitting parts to change a chromaticity of the light in which the ratio of the amounts of the light is adjusted.

[Clause 5] The light emitting module according to any one of clauses 1 to 4, wherein
  (i) a first position is located at a light emitting part of the plurality of light emitting parts,
  ii) a second position is an irradiation position that is irradiated with light emitted from the light emitting part and transmitted through the first lens, and
  the first position and the second position are point-symmetric with respect to the center axis of the first lens in a top view.

<Clause 6> The light emitting module according to any one of clauses 1 to 5, further comprising:
  a plurality of second lenses provided between the optical member and the first lens, wherein
  the plurality of second lenses overlap the plurality of light emitting parts in the top view, and the plurality of second lenses are arranged in one-to-one correspondence with the plurality of light emitting parts.

<Clause 7> The light emitting module according to clause 6, wherein the change mechanism integrally moves the optical member and the plurality of second lenses in the direction along the center axis of the first lens.

<Clause 8> The light emitting module according to any one of clauses 1 to 7, further comprising:
  a third lens including a plurality of light distribution parts, wherein
    the plurality of light distribution parts are provided between the optical member and the plurality of light emitting parts,
    the plurality of light distribution parts overlap the plurality of light emitting parts in the top view,
    the plurality of light distribution parts are arranged in one-to-one correspondence with the plurality of light emitting parts, and
    the plurality of light distribution parts define distribution of the light emitted from the plurality of light emitting parts.

<Clause 9> The light emitting module according to clause 8, wherein the change mechanism integrally moves the optical member and the third lens including the plurality of light distribution parts in the direction along the center axis of the first lens.

<Clause 10> The light emitting module according to any one of clauses 1 to 9, wherein the second region is provided around the first region in the top view.

<Clause 11> The light emitting module according to any one of clauses 1 to 10, wherein
  the plurality of light emitting parts respectively have light emitting surfaces, and are arranged at equal intervals along at least one of a vertical direction or a lateral direction,
  the optical member includes a plurality of first regions arranged in one-to-one correspondence with the light emitting surfaces of the plurality of light emitting parts,
  the light emitting surfaces are located inward of the respective first regions in the top view,
  the change mechanism changes a distance δ between the optical member and the plurality of light emitting parts by causing a relative movement between the optical member and the plurality of light emitting parts along the center axis of the first lens, and
  the distance δ by the relative movement between the optical member and the plurality of light emitting parts is represented by Formula (1) or Formula (2) below, $$0 < \delta_1 \leq \frac{d}{2 \cdot \tan(\theta/2)} \quad (1)$$

$$0 < \delta_2 \leq \frac{2 \cdot d - p}{2 \cdot \tan(\theta/2)} \quad (2)$$

wherein in the Formula (1), d represents a distance by which centers of adjacent ones of the plurality of light emitting parts are located apart from each other along either the vertical direction or the lateral direction in the top view, and θ represents a directivity half-value angle of light emitted from one of the plurality of light emitting parts, and
  wherein in the Formula (2), d represents the distance by which the centers of the adjacent ones of the plurality of light emitting parts are located apart from each other along either the vertical direction or the lateral direction in the top view, p represents a width of one of the plurality of first regions along the vertical direction or the lateral direction, and θ represents the directivity half-value angle of the light emitted from one of the plurality of light emitting parts.

<Clause 12> The light emitting module according to any one of clauses 1 to 11, wherein the optical member includes a plurality of first regions and a plurality of second regions.

<Clause 13> The light emitting module according to any one of clauses 1 to 12, wherein
  the first region includes at least one of:
    a transmitting portion configured to transmit light emitted from a corresponding one of the plurality of light emitting parts,
    a color filter configured to transmit light having a given wavelength of the light emitted from the corresponding one of the plurality of light emitting parts, or
    a wavelength conversion substance configured to convert the light emitted from the corresponding one of the plurality of light emitting parts into the light having the given wavelength, and
  the second region includes at least one of:
    a transmitting portion configured to transmit light emitted from a corresponding one of the plurality of light emitting parts,
    a color filter configured to transmit light having a different wavelength from the given wavelength of the light emitted from the corresponding one of the plurality of light emitting parts, or
    a wavelength conversion substance configured to convert the light emitted from the corresponding one of the plurality of light emitting parts into the light having the different wavelength.

This application is based on and claims priority to Japanese Patent Application No. 2022-054467, filed on Mar. 29, 2022, the entire contents of which are incorporated herein by reference.

DESCRIPTION OF THE REFERENCE NUMERALS 1, 10 light emitting part
11 light emitting surface
12 light emitting element
13 electrode
14 light transmissive member
15 covering member
2 filter
21 first region
22 second region
3 change mechanism
31 mover
32 spring
33 support
4 first lens
41 center axis
42 first convex surface
43 second convex surface
5 light-emitting-part mounting substrate
51 wiring
52 electrically-conductive adhesive member
6 housing
61 opening
62 holding portion
7 second lens
8 diffusion plate 9 first lens moving mechanism
20 third lens
20a light distribution part
100 light emitting module
d distance
La white light
Lb amber light
p region width
q light emitting surface width
S irradiation region
T irradiation position
δ, δ₁, δ₂ distance
θ directivity half-value angle

The invention claimed is:

1. A light emitting module comprising:
a plurality of light emitting parts;
an optical member including a first region where light having a first chromaticity is extracted and a second region where light having a second chromaticity different from the first chromaticity is extracted, and configured to transmit or pass light emitted from the plurality of light emitting parts;
a first lens on which light transmitted or passing through the optical member is incident; and
a change mechanism configured to change a distance between the optical member and the plurality of light emitting parts in a direction along a center axis of the first lens; wherein
the first region or the second region is provided so as to correspond to one of the plurality of light emitting parts.

2. The light emitting module according to claim 1, wherein the plurality of light emitting parts are arranged in a grid pattern.

3. The light emitting module according to claim 1, further comprising:
a moving mechanism configured to cause a relative movement between the first lens and the plurality of light emitting parts along a direction intersecting the center axis of the first lens.

4. The light emitting module according to claim 1, wherein
the optical member is configured to extract, of the light emitted from the plurality of light emitting parts, light in which a ratio of an amount of light transmitted or passing through the first region to an amount of light transmitted or passing through the second region is adjusted, and
the change mechanism changes the distance between the optical member and the plurality of light emitting parts to change a chromaticity of the light in which the ratio of the amounts of the light is adjusted.

5. The light emitting module according to claim 1, wherein
(i) a first position is located at a light emitting part of the plurality of light emitting parts,
(ii) a second position is an irradiation position which is irradiated with light emitted from the light emitting part and transmitted through the first lens, and
the first position and the second position are point-symmetric with respect to the center axis of the first lens in a top view.

6. The light emitting module according to claim 1, further comprising:
a plurality of second lenses provided between the optical member and the first lens, wherein
the plurality of second lenses overlap the plurality of light emitting parts in the top view, and
the plurality of second lenses are arranged in one-to-one correspondence with the plurality of light emitting parts.

7. The light emitting module according to claim 6, wherein the change mechanism integrally moves the optical member and the plurality of second lenses in the direction along the center axis of the first lens.

8. The light emitting module according to claim 1, further comprising:
a third lens including a plurality of light distribution parts, wherein
the plurality of light distribution parts are provided between the optical member and the plurality of light emitting parts,
the plurality of light distribution parts overlap the plurality of light emitting parts in the top view,
the plurality of light distribution parts are arranged in one-to-one correspondence with the plurality of light emitting parts, and
the plurality of light distribution parts define distribution of the light emitted from the plurality of light emitting parts.

9. The light emitting module according to claim 8, wherein the change mechanism integrally moves the optical member and the third lens including the plurality of light distribution parts in the direction along the center axis of the first lens.

10. The light emitting module according to claim 1, wherein the second region is provided around the first region in the top view.

11. The light emitting module according to claim 1, wherein
the plurality of light emitting parts respectively have light emitting surfaces, and are arranged at equal intervals along at least one of a vertical direction or a lateral direction,
the optical member includes a plurality of first regions arranged in one-to-one correspondence with the light emitting surfaces of the plurality of light emitting parts,
the light emitting surfaces are located inward of the respective first regions in the top view,
the change mechanism changes a distance δ between the optical member and the plurality of light emitting parts by causing a relative movement between the optical member and the plurality of light emitting parts along the center axis of the first lens, and
the distance δ by the relative movement between the optical member and the plurality of light emitting parts is represented by Formula (1) or Formula (2) below, $$0 < \delta_1 \leq \frac{d}{2 \cdot \tan(\theta/2)} \quad (1)$$

$$0 < \delta_2 \leq \frac{2 \cdot d - p}{2 \cdot \tan(\theta/2)} \quad (2)$$

wherein in the Formula (1), d represents a distance by which centers of adjacent ones of the plurality of light emitting parts are located apart from each other along either the vertical direction or the lateral direction in the top view, and θ represents a directivity half-value angle of light emitted from one of the plurality of light emitting parts, and wherein in the Formula (2), d represents the distance by which the centers of the adjacent ones of the plurality of light emitting parts are located apart from each other along either the vertical direction or the lateral direction in the top view, p represents a width of one of the plurality of first regions along the vertical direction or the lateral direction, and θ represents the directivity half-value angle of the light emitted from one of the plurality of light emitting parts.

12. The light emitting module according to claim 1, wherein the optical member includes a plurality of first regions and a plurality of second regions.

13. The light emitting module according to claim 1, wherein the first region includes at least one of:
  a transmitting portion configured to transmit light emitted from a corresponding one of the plurality of light emitting parts,
  a color filter configured to transmit light having a given wavelength of the light emitted from the corresponding one of the plurality of light emitting parts, or
  a wavelength conversion substance configured to convert the light emitted from the corresponding one of the plurality of light emitting parts into the light having the given wavelength, and the second region includes at least one of:
  a transmitting portion configured to transmit light emitted from a corresponding one of the plurality of light emitting parts,
  a color filter configured to transmit light having a different wavelength from the given wavelength of the light emitted from the corresponding one of the plurality of light emitting parts, or
  a wavelength conversion substance configured to convert the light emitted from the corresponding one of the plurality of light emitting parts into the light having the different wavelength.

* * * * *